(12) United States Patent
Takeda et al.

(10) Patent No.: US 10,288,707 B2
(45) Date of Patent: May 14, 2019

(54) RELAXATION TIME MEASURING METHOD AND MAGNETIC RESONANCE MEASURING APPARATUS

(71) Applicants: Kyoto University, Kyoto (JP); JEOL Ltd., Tokyo (JP)

(72) Inventors: Kazuyuki Takeda, Kyoto (JP); Takayuki Suzuki, Tokyo (JP)

(73) Assignees: Kyoto University, Kyoto (JP); JEOL Ltd., Tokyo (JP)

( * ) Notice: Subject to any disclaimer, the term of this patent is extended or adjusted under 35 U.S.C. 154(b) by 100 days.

(21) Appl. No.: 15/660,106

(22) Filed: Jul. 26, 2017

(65) Prior Publication Data

US 2018/0031657 A1 Feb. 1, 2018

(30) Foreign Application Priority Data

Jul. 28, 2016 (JP) ................. 2016-148814

(51) Int. Cl.
*G01R 33/50* (2006.01)
*G01R 33/56* (2006.01)
*G01R 33/54* (2006.01)
*G01R 33/30* (2006.01)
*G01R 33/44* (2006.01)

(52) U.S. Cl.
CPC .......... *G01R 33/50* (2013.01); *G01R 33/30* (2013.01); *G01R 33/44* (2013.01); *G01R 33/54* (2013.01); *G01R 33/5602* (2013.01)

(58) Field of Classification Search
CPC ........ G01R 33/50; G01R 33/44; G01R 33/54; G01R 33/5602
See application file for complete search history.

(56) References Cited

U.S. PATENT DOCUMENTS

2016/0061915 A1* 3/2016 Teklemariam ......... G01N 24/08
 324/309
2016/0097832 A1 4/2016 Suzuki

FOREIGN PATENT DOCUMENTS

JP 201675665 A 5/2016

OTHER PUBLICATIONS

Mccoy, M. A., and W. S. Warren. "Three-Quantum Nuclear Magnetic Resonance Spectroscopy of Liquid Water: Intermolecular Multiple-Quantum Coherence Generated by Spin-Cavity Coupling." The Journal of Chemical Physics, vol. 93, No. 1, 1990, pp. 858-860., doi:10.1063/1.459457. (Year: 1990).*
Bienfait, A., et al. "Controlling Spin Relaxation with a Cavity." Nature, vol. 531, No. 7592, 2016, pp. 74-77., doi:10.1038/nature16944. (Year: 2016).*

* cited by examiner

*Primary Examiner* — Gregory H Curran
(74) *Attorney, Agent, or Firm* — The Webb Law Firm

(57) ABSTRACT

A method includes forming N spin-cavity coupling states that are mutually different in coupling state between a cavity accommodating a sample therein and a spin of the sample, calculating N values of spin-cavity coupling constant, measuring N values of apparent relaxation time through magnetic resonance measurement applied on the sample, and calculating relaxation time corresponding to specific spin-cavity coupling constant based on the relationship between the N values of spin-cavity coupling constant and the N values of apparent relaxation time.

15 Claims, 19 Drawing Sheets

| $g(\omega)$ | SPIN-CAVITY COUPLING CONSTANT | $\gamma_m/2$ | RELAXATION RATE OF SPIN SYSTEM |
| --- | --- | --- | --- |
| $\kappa$ | RADIATIVE DECAY RATE FROM CAVITY TO TRANSMISSION SYSTEM | $\kappa'$ | RADIATIVE DECAY RATE FROM CAVITY TO IN-CAVITY CONDUCTOR |
| $\hat{a}$ | GENERATION/ANNIHILATION OPERATOR OF SPIN SYSTEM | $\hat{b}$ | GENERATION/ANNIHILATION OPERATOR OF RESONATOR |

RELAXATION TIME MEASURING METHOD AND MAGNETIC RESONANCE MEASURING APPARATUS

CROSS REFERENCE TO RELATED APPLICATION

The entire disclosure of Japanese Patent Application No. 2016-148814 filed on Jul. 28, 2016 including the specification, claims, drawings, and abstract is incorporated herein by reference in its entirety.

TECHNICAL FIELD

The present disclosure relates to a method for measuring relaxation time of a sample to be subjected to magnetic resonance measurement, and to a related magnetic resonance measuring apparatus.

BACKGROUND

Nuclear magnetic resonance (NMR) measuring apparatuses and electron spin resonance (ESR) measuring apparatuses are conventionally known as representative magnetic resonance measuring apparatuses. Magnetic resonance imaging (MRI) apparatuses are known as devices similar to the NMR measuring apparatuses. Hereinafter, the ESR measuring apparatus will be described in detail below.

The ESR measuring apparatus is a type of magnetic resonance measuring apparatus, which can irradiate a sample placed in a static magnetic field with microwaves and record a state where the microwaves are absorbed by the sample as a spectrum.

Meanwhile, relaxation time of electron spin and nuclear spin, particularly spin lattice relaxation time ($T_1$), corresponds to a parameter indicating physical properties and mobility of a magnetic material, or a parameter indicating oxygen concentration environment in which magnetic ions are placed in a living body. Measurement and evaluation of the relaxation time are important in fundamental research and applied research. Hereinafter, a method for measuring the $T_1$ will be described.

First, a $T_1$ measuring method that may be referred to as "inversion recovery method" will be described with reference to FIGS. 13 to 15. FIG. 13 illustrates an exemplary ESR measuring apparatus used for the measurement.

A sample tube, in which a sample 100 is placed, is disposed in a cavity 102 (e.g., a microwave resonator) functioning as a resonance circuit. The cavity 102 is disposed between two electromagnets 104, so that the cavity 102 can be placed in a static magnetic field generated by the electromagnets 104.

A microwave oscillator 106 generates microwaves and supplies the generated microwaves to a switch 108. The switch 108 performs a predetermined switching operation (e.g., ON and OFF switching operation) to form microwave pulses. An amplifier 110 amplifies the microwave pulses and supplies the amplified microwave pulses to the cavity 102 via a circulator 112.

When an ESR phenomenon occurs due to irradiation with the microwave pulses, reflected microwaves can be taken out via the circulator 112. The reflected microwaves are supplied to an amplifier 114. The reflected microwaves amplified by the amplifier 114 are supplied to a wave detector 116 (e.g., a mixer). A signal output from the wave detector 116 passes through an AD converter 118. Thus, a DC component signal is supplied to a personal computer (PC) 120. The PC 120 performs signal processing on the supplied signal to obtain an ESR spectrum signal.

FIG. 14 illustrates exemplary microwave pulses and spin echo intensity. The illustrated microwave pulses are exemplary microwave pulses that may be supplied in the measurement of the relaxation time $T_1$ according to the inversion recovery method. The horizontal axis represents time.

The measurement of the relaxation time $T_1$ includes irradiating the cavity 102 with a high-frequency high power pulse (i.e., π pulse) to invert the magnetization of the spin in the sample 100 with respect to the direction of the static magnetic field. The measurement further includes sequentially irradiating similar high-frequency high power pulses (i.e., π/2 pulse and π pulse) at the interval of time τ after a predetermined waiting time T elapses (Hahn echo sequence). In this case, the irradiation with the π/2 pulse may be performed only one time (FID sequence). A spin echo can be obtained when the Hahn echo sequence is performed. An FID signal can be obtained when the FID sequence is performed.

It is feasible to obtain spin echo intensity $I_{echo}$ or peak intensity through FFT performed on the FID signal, corresponding to the waiting time T, by sequentially performing the measurements a plurality of times (e.g., 10 or more times) while changing the above-mentioned waiting time T.

FIG. 15 is a graph obtained by plotting the spin echo intensity $I_{echo}$ with respect to the waiting time T. Fitting an exponential function defined by the following formula (1) to the obtained data of the spin echo intensity $I_{echo}$ can obtain apparent relaxation time $T_1^*$.

[Numerical expression 1]

$$I_{echo} = I_0 \left[ \left( 1 - 2e^{-\frac{T}{T_1^*}} \right) \right] \quad (1)$$

Next, a $T_1$ measuring method that may be referred to as "saturation recovery method" will be described in detail below with reference to FIGS. 16 to 18. FIG. 16 illustrates an exemplary ESR measuring apparatus used for the measurement. The ESR measuring apparatus includes a path 122 provided to supply microwaves for monitoring, in addition to the configuration of the ESR measuring apparatus illustrated in FIG. 13. The rest of the configuration is similar to the configuration of the ESR measuring apparatus illustrated in FIG. 13.

FIG. 17 illustrates exemplary saturation pulse and detection signal ($I_{mw}$). The saturation pulse is an example of the microwave pulse to be supplied in the measurement of the relaxation time $T_1$ according to the saturation recovery method. The horizontal axis represents time.

The measurement of the relaxation time $T_1$ includes irradiating the cavity 102 with a long-time high-frequency high power pulse (i.e., saturation pulse) and fixing the spin magnetization in the sample 100 to zero (0). The measurement further includes irradiating the cavity 102 with a high-frequency low power pulse upon terminating the irradiation with the high-frequency high power pulse (i.e., the saturation pulse), and sequentially monitoring recovery (or restoration) of the spin magnetization from the zero (0) fixed state to an equilibrium magnetization (detection signal $I_{mw}$).

FIG. 18 is a graph obtained by plotting the detection signal $I_{mw}$ with respect to the time T. Fitting an exponential function defined by the following formula (2) to the obtained data of the detection signal $I_{mw}$ can obtain apparent relaxation time $T_1^*$.

[Numerical expression 2]

$$I_{mw} = I_0 \left[ \left(1 - 2e^{-\frac{T}{T_1^*}}\right) \right] \quad (2)$$

Next, a $T_1$ measuring method that may be referred to as "frequency swept longitudinal detection method" (fs-LOD method) will be described in detail below with reference to FIGS. 19 to 21. FIG. 19 illustrates an exemplary ESR measuring apparatus used for the measurement.

A sample tube, in which a sample 100 is placed, is disposed in a cavity 102 that functions as a resonance circuit. The cavity 102 is disposed between two electromagnets 104. Further, pickup coils 124, each having a winding axis extending in a direction parallel to a static magnetic field, are disposed adjacently to the sample 100.

A microwave oscillator 106 generates microwaves and supplies the generated microwaves to a switch 108. On the other hand, a pulse generator 126 generates a reference signal with modulation frequency. The reference signal is supplied to the switch 108 so that the switch 108 can repeat ON and OFF operations according to the modulation frequency. In other words, the microwaves are modulated according to the modulation frequency. An amplifier 110 amplifies the modulated microwaves and supplies the amplified modulated microwaves to the cavity 102 via a circulator 112. When an ESR phenomenon occurs due to sweeping of the static magnetic field, an $M_z$ component of the electron spin changes and induced voltage is generated in the pickup coils 124. An amplifier 114 amplifies the induced voltage and supplies the amplified voltage to a phase detector 128. Variation of the induced voltage is synchronous with the modulation frequency. Accordingly, the phase detector 128 performs lock-in detection using the reference signal supplied from a pulse generator 126. A signal output from the phase detector 128 passes through an AD converter 118. Thus, a DC component signal is supplied to a PC 120. The PC 120 performs signal processing on the supplied signal to obtain an ESR spectrum signal.

FIG. 20 illustrates modulation frequency and an example of lock-in detected signal. The modulation frequency is an example of the modulation frequency to be used in the measurement of the relaxation time $T_1$ according to the frequency swept longitudinal detection method (fs-LOD method). The horizontal axis represents time.

The measurement of the relaxation time $T_1$ includes causing the pulse generator 126 to modulate the output intensity of microwaves supplied from the microwave oscillator 106 at a predetermined modulation frequency $f_{mod}$ and irradiating the cavity 102 with the modulated microwaves. Similar effects can be obtained by performing simultaneous and continuous irradiation with two high-frequency components separated at frequency $\Delta f$ corresponding to the modulation frequency $f_{mod}$, instead of modulating the microwaves at the modulation frequency $f_{mod}$.

The measurement further includes detecting temporal variation in magnetization of the spin in the direction of the static magnetic field, with the pickup coils 124, and performing the lock-in detection at the modulation frequency $f_{mod}$ or the frequency $\Delta f$, caused by the above-mentioned irradiation of the microwaves, so that a signal $S_{LOD}$ can be obtained.

Obtaining the signal $S_{LOD}$ while changing the modulation frequency $f_{mod}$ or the frequency $\Delta f$ can obtain attenuation data of the signal $S_{LOD}$ depending on the modulation frequency. FIG. 21 is a graph illustrating the signal $S_{LOD}$ with respect to the modulation frequency. Fitting a function defined by the following formula (3) to the obtained data of the signal $S_{LOD}$ can obtain apparent relaxation time $T_1^*$.

[Numerical expression 3]

$$S_{LOD} = \frac{C}{\sqrt{\frac{1}{T_1^{*2}} + \omega^2}} \quad (3)$$

Next, a $T_1$ measuring method that may be referred to as the "perturbative LOT-$T_1$ method" (p-LOD-$T_1$ method) will be described with reference to FIGS. 22 to 24. FIG. 22 illustrates an exemplary ESR measuring apparatus for the measurement. The illustrated ESR measuring apparatus has a configuration basically similar to that of the ESR measuring apparatus illustrated in FIG. 19.

FIG. 23 illustrates a sequence of microwave pulses and examples of lock-in detected signals. The illustrated microwave pulses are microwave pulses that can be used in the measurement of the relaxation time $T_1$ according to the perturbative LOT-$T_1$ method (i.e., the p-LOD-T1 method).

The measurement of the relaxation time $T_1$ includes causing a pulse generator 130 to continuously generate two pulse voltages at the interval of time $\tau$ every repetition time $T_{rep}$, for modulation of the output intensity of the microwaves supplied from the microwave oscillator 106, and irradiating the cavity 102 with the modulated microwaves.

The measurement further includes detecting temporal variation in magnetization of the spin in the direction of the static magnetic field occurring due to the above-mentioned irradiation with microwaves, with the pickup coils 124, while changing the time $\tau$ and performing lock-in detection at a modulation frequency $f_{mod}=1/T_{rep}$ so that the signal $S_{LOD}$ can be obtained. FIG. 24 is a graph illustrating the signal $S_{LOD}$ with respect to the time $\tau$. In FIGS. 23 and 24, a curve indicated by reference numeral 132 illustrates the signal $S_{LOD}$ detected according to the perturbative LOT-$T_1$ method (i.e., the p-LOD-T1 method) and a curve indicated by reference numeral 134 illustrates the signal $S_{LOD}$ detected according to the inversion LOD-$T_1$ method. The microwave pulses with which the cavity 102 is irradiated according to the inversion LOD-$T_1$ method are stronger than those according to the perturbative LOT-$T_1$ method (i.e., the p-LOD-T1 method).

Fitting a function defined by the following formula (4) to the data of the signal $S_{LOD}$ detected according to the inversion LOD-$T_1$ method can obtain the apparent relaxation time $T_1^*$.

[Numerical expression 4]

$$S_{LOD} = M\left[1 - 2e^{\frac{-\tau}{T_1^*}}\right] + K\sqrt{2(1+\cos(2\pi f_{mod}\tau))} \quad (4)$$

Further, fitting a function defined by the following formula (5) to the data of the signal $S_{LOD}$ detected according to the perturbative LOT-$T_1$ method (i.e., the p-LOD-T1 method) can obtain the apparent relaxation time $T_1^*$.

[Numerical expression 5]

$$S_{LOD} = M\left[e^{\frac{-\tau}{T_1}}\right] + K\sqrt{2(1 + \cos(2\pi f_{mod}\tau))} \quad (5)$$

An apparatus discussed in Japanese Patent Application Laid-Open No. 2016-75665 is available in the measurement of the relaxation time according to the perturbative LOT-$T_1$ method (i.e., the p-LOD-T1 method).

In the ESR measuring method and the NMR measuring method, a strong interaction different from the magnetic resonance is manifested between the spin and the resonance circuit (i.e., the cavity or the NMR probe), which may be called "spin-cavity coupling," when the spin concentration (i.e., sample amount) of a sample is large, when the sample is a substance having strong magnetism, when the Q value of a cavity (resonator) or an NMR probe serving as a resonance circuit is very high, or when the spin lattice relaxation time is very long.

The spin-cavity coupling is a phenomenon constantly occurring when the resonance frequency of the spin coincides with the resonance frequency of the resonance circuit. However, if the spin concentration is low and the total amount of spin itself is very small, the coupling constant is so small that the measurement will not be hindered.

However, if the measurement is performed under the above-mentioned conditions, the following problems may arise. For example, the line width of a spectrum will become extraordinarily wider and the original spectrum of the substance will not appear. The spectrum will be distorted and the measurement itself will become unfeasible. During the measurement of the spin lattice relaxation time $T_1$, spin-cavity coupling constant $g(\omega)$ will change to accelerate the relaxation, and obtaining a normal function will not be feasible. If the spin lattice relaxation time $T_1$ of a magnetic substance is evaluated under such conditions, the observed apparent relaxation time $T_1^*$ may be observed to be smaller than the substance's relaxation time $T_1$ (i.e., true relaxation time $T_1$), because the apparent line width is widened in the spectrum.

Due to the presence of the spin-cavity coupling, the observed relaxation time (i.e., the apparent relaxation time) will change depending on the amount of a sample placed in the resonance circuit (i.e., the cavity or the NMR probe), the Q value of the resonance circuit, or a sample filling rate for the resonance circuit. More specifically, even when the same sample is used, the obtained value of the relaxation time will vary depending on the specification of the detection circuit or the measuring method of the relaxation time $T_1$. As mentioned above, it is difficult to accurately measure the relaxation time $T_1$ when the spin concentration of a sample is high, when the Q value of the resonance circuit is extraordinarily high, or when the sample filling rate is very high.

The present disclosure intends to obtain an accurate relaxation time of a sample even under conditions where the influence of the spin-cavity coupling is large.

SUMMARY

A relaxation time measuring method according to the present disclosure includes forming N spin-cavity coupling states that are mutually different in coupling state between a resonator functioning as a resonance circuit accommodating a sample therein and a spin of the sample, calculating N values of spin-cavity coupling constant that represent constants of the N spin-cavity coupling states, measuring N values of apparent relaxation time through magnetic resonance measurement applied on the sample, and calculating relaxation time corresponding to specific spin-cavity coupling constant based on the relationship between the N values of spin-cavity coupling constant and the N values of apparent relaxation time.

According to the above-mentioned configuration, since the relationship between the spin-cavity coupling constant and the apparent relaxation time can be obtained, it is feasible to obtain the relaxation time corresponding to the specific spin-cavity coupling constant even under the condition that the influence of the spin-cavity coupling is relatively large. For example, relaxation time obtainable when the spin-cavity coupling constant is zero (0) corresponds to the relaxation time obtainable when the spin-cavity coupling is not present. Obtaining the relaxation time described above can obtain the true relaxation time peculiar to the sample.

The calculation of the spin-cavity coupling constants may include calculating spin-cavity coupling constant based on actually measured return loss value of the resonance circuit measured for each magnetic field and a model-based theoretical return loss value of the resonance circuit in a case where the spin-cavity coupling is present.

The calculation of the spin-cavity coupling constants may include calculating a spin-cavity coupling constant that minimizes the difference between the measured value and the theoretical value.

Forming the N spin-cavity coupling states is feasible by changing the sample amount to N levels.

Forming the N spin-cavity coupling states is feasible by changing the Q value of the resonance circuit to N levels.

The measurement of the relaxation times may include measuring the apparent relaxation time according to a measuring method in which the apparent relaxation time does not change during the magnetic resonance measurement.

The measuring method in which the apparent relaxation time does not change includes a measuring method in which the apparent relaxation time does not change at all (i.e., a measuring method in which acceleration or deceleration of the relaxation rate does not occur at all), a measuring method in which the change is not significant, and a measuring method in which the change is very small. Employing such a measuring method can measure the apparent relaxation time under a constant or substantially constant spin-cavity coupling state (or spin-cavity coupling constant). Therefore, it becomes feasible to associate the spin-cavity coupling constant with the apparent relaxation time.

The calculation of the relaxation times may include calculating the relaxation time corresponding to the specific spin-cavity coupling constant by fitting a quadratic function of the spin-cavity coupling constant to the relationship between the N values of spin-cavity coupling constant and the N values of apparent relaxation time.

The specific spin-cavity coupling constant may be zero and the calculation of the relaxation times may include calculating the relaxation time when the spin-cavity coupling constant is zero.

Further, a magnetic resonance measuring apparatus according to the present disclosure includes a resonator functioning as a resonance circuit accommodating a sample, a forming unit configured to form N spin-cavity coupling states that are mutually different in coupling state between a spin of the sample and the resonance circuit, a coupling constant calculation unit configured to calculate N values of spin-cavity coupling constant that represent constants of the N spin-cavity coupling states, a measurement unit configured to measure N values of apparent relaxation time through magnetic resonance measurement applied on the sample, and a relaxation time calculation unit configured to calculate relaxation time corresponding to specific spin-cavity coupling constant based on the relationship between the N values of spin-cavity coupling constant and the N values of apparent relaxation time.

The coupling constant calculation unit may calculate spin-cavity coupling constant based on actually measured return loss value of the resonance circuit measured for each magnetic field and a model-based theoretical return loss value of the resonance circuit in a state where the spin-cavity coupling is present.

The coupling constant calculation unit may calculate a spin-cavity coupling constant that minimizes the difference between the measured value and the theoretical value.

The forming unit may form the N spin-cavity coupling states by changing the Q value of the resonance circuit to N levels.

The measurement unit may measure the apparent relaxation time according to a measuring method in which the apparent relaxation time does not change during the magnetic resonance measurement.

The relaxation time calculation unit may calculate the relaxation time corresponding to the specific spin-cavity coupling constant by fitting a quadratic function of the spin-cavity coupling constant to the relationship between the N values of spin-cavity coupling constant and the N values of apparent relaxation time.

The specific spin-cavity coupling constant may be zero and the relaxation time calculation unit may calculate the relaxation time when the spin-cavity coupling constant is zero.

According to the present disclosure, it is feasible to obtain an accurate relaxation time of a sample even under conditions where the influence of the spin-cavity coupling is large.

BRIEF DESCRIPTION OF DRAWINGS

Embodiment(s) of the present disclosure will be described by reference to the following figures, wherein.

DESCRIPTION OF EMBODIMENTS

First Embodiment

Figure 1:
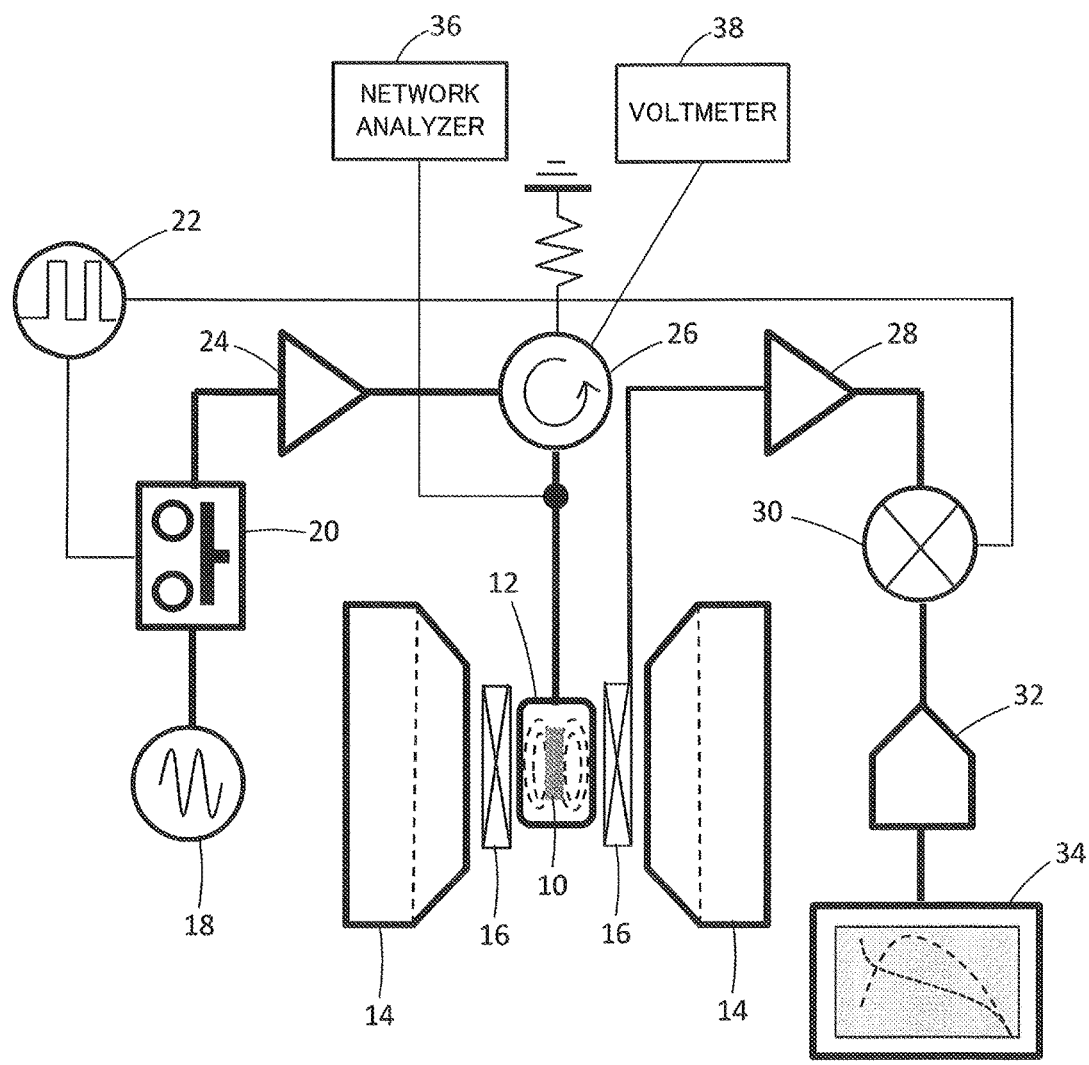
FIG. 1 illustrates an exemplary ESR measuring apparatus according to a first embodiment.

A relaxation time measuring method and an electron spin resonance measuring apparatus (ESR measuring apparatus) according to the first embodiment of the present disclosure will be described in detail below. FIG. 1 illustrates an exemplary ESR measuring apparatus according to the first embodiment. The ESR measuring apparatus is an apparatus capable of realizing the perturbative LOT-$T_1$ method (i.e., the p-LOD-T1 method).

A sample tube, in which a sample 10 is placed, is disposed in a cavity 12 (e.g., a microwave resonator) that functions as a resonance circuit. The sample 10 may be any one of gas, solid, and liquid. The cavity 12 is disposed between two electromagnets 14, so that the cavity 12 is positioned in a static magnetic field generated by the electromagnets 14. Further, a pair of pickup coils 16 each having a winding axis extending in a direction parallel to the static magnetic field is disposed adjacently to the sample 10. Helium or any other appropriate coolant can be supplied to the inside of the sample tube so that the sample 10 can be cooled.

A microwave oscillator 18 generates microwaves that can be supplied to a switch 20. The switch 20 performs a switching operation (e.g., ON and OFF switching) to form microwave pulses.

Meanwhile, a pulse generator 22 generates a reference signal with modulation frequency. The reference signal is supplied to the switch 20, so that the switch 20 repeats the ON and OFF switching operation according to the modulation frequency. Accordingly, the microwaves supplied from the microwave oscillator 18 can be modulated according to the modulation frequency. The modulated microwaves are amplified by an amplifier 24 and supplied to the cavity 12 via a circulator 26.

The static magnetic field is swept with the electromagnets 14. The sweeping can be performed continuously or stepwise. When an ESR phenomenon occurs due to the sweeping of the static magnetic field, an $M_z$ component of the electron spin (i.e., a magnetization component parallel to the static magnetic field) changes and induced voltage is generated in the pickup coils 16. An amplifier 28 amplifies a detection signal indicating the induced voltage and supplies the amplified signal to a phase detector 30. Variation of the induced voltage is synchronous with the modulation frequency.

The phase detector 30 is, for example, a phase sensitive detector (PSD). The phase detector 30 performs phase detection (e.g., lock-in detection) on the detection signal with the reference signal supplied from the pulse generator 22. A signal output from the phase detector 30 passes through an AD converter 32. Thus, a DC component signal is supplied to a personal computer PC 34. The PC 34 performs signal processing on the supplied signal to obtain an ESR spectrum signal.

Further, a network analyzer 36 is connected to a path connecting the cavity 12 and the circulator 26. The network analyzer 36, serving as a resonance circuit, measures an $S_{11}$ parameter (return loss, reflection coefficient) of the cavity 12; namely, a ratio of output signal (i.e., output voltage) of the cavity 12 to input signal (i.e., input voltage) of the cavity 12.

A voltmeter 38 can be connected to the circulator 26. The voltmeter 38 detects the output signal (i.e., output voltage) of the cavity 12. The $S_{11}$ parameter of the cavity 12 can be measured based on the signal (input signal or input voltage) supplied from the microwave oscillator 18 and the output voltage detected by the voltmeter 38. Although both the network analyzer 36 and the voltmeter 38 are illustrated in FIG. 1, the ESR measuring apparatus according to the first embodiment may include either one of the network analyzer 36 and the voltmeter 38. Needless to say, the ESR measuring apparatus may include both of them.

Figure 2:
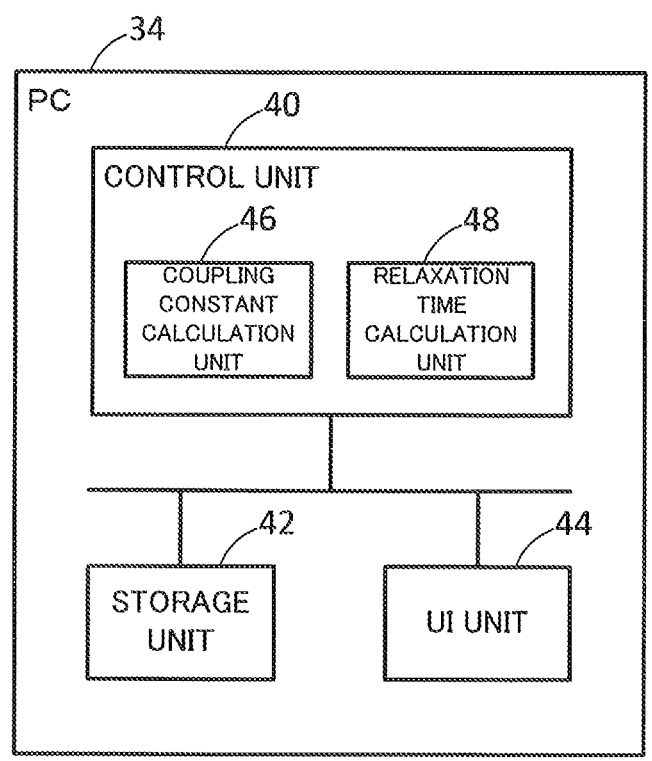
FIG. 2 is a block diagram illustrating an exemplary personal computer (PC)

FIG. 2 illustrates an exemplary configuration of the PC 34. The PC 34 includes a control unit 40, a storage unit 42, and a user interface unit (UI unit) 44.

The control unit 40 includes a processor, such as a central processing unit (CPU), and can control various units constituting the PC 34. Further, the control unit 40 includes a coupling constant calculation unit 46 and a relaxation time calculation unit 48. The coupling constant calculation unit 46 has a function of calculating spin-cavity coupling constant $g(\omega)$. The relaxation time calculation unit 48 has a function of calculating apparent relaxation time $T_1^*$ corresponding to specific spin-cavity coupling constant $g(\omega)$ based on the relationship between the spin-cavity coupling constant and the measured apparent relaxation time $T_1^*$. The apparent relaxation time $T_1^*$ can be measured according to a measuring method in which the apparent relaxation time $T_1^*$ does not change during the ESR measurement. The measuring method employed in the first embodiment is the perturbative LOT-$T_1$ method (i.e., the p-LOD-T1 method). As described below, a measuring method employed in the second embodiment is the frequency swept longitudinal detection method (the fs-LOD method). For example, the relaxation time calculation unit 48 calculates, as true relaxation time $T_1$, apparent relaxation time $T_1^*$ obtainable when the spin-cavity coupling constant $g(\omega)$ is zero (0). An exemplary method for calculating the spin-cavity coupling constant and an exemplary method for calculating the relaxation time will be described in detail below.

The storage unit 42 is a storage device, such as a hard disk drive or a memory, which can store various programs, various control data, and measurement data.

The UI unit 44 is a user interface, which includes a display unit and an operation unit. The display unit is a liquid crystal display device or any other comparable display device. The operation unit is an input apparatus including a keyboard and a mouse.

The measurement of the apparent relaxation time $T_1^*$ includes causing the pulse generator 22 to continuously generate two pulse voltages at the interval of T every repetition time $T_{rep}$, modulating the output intensity of the microwaves supplied from the microwave oscillator 18, and irradiating the cavity 12 with the modulated microwaves.

The measurement further includes detecting temporal variation in magnetization of the spin in the direction of the static magnetic field, caused by the above-mentioned irradiation of microwaves, with the pickup coils 16, while changing the time τ and performing lock-in detection at a modulation frequency $f_{mod}=1/T_{rep}$ so that the signal $S_{LOD}$ can be obtained. The obtained signal $S_{LOD}$ is a signal detected according to the perturbative LOT-$T_1$ method (i.e., the p-LOD-T1 method).

Hereinafter, embodiments 1 and 2, serving as exemplary embodiments of the relaxation time measuring method according to the first embodiment, will be described in detail below.

Embodiment 1

A relaxation time measuring method according to embodiment 1 will be described in detail below. The method according to embodiment 1 includes measuring apparent relaxation time $T_1^*$ according to the perturbative LOT-$T_1$ method (i.e., the p-LOD-T1 method), while changing the amount of sample 10, obtaining a relationship between the spin-cavity coupling constant $g(\omega)$ and the apparent relaxation time $T_1^*$, and obtaining apparent relaxation time $T_1^*$ corresponding to specific spin-cavity coupling constant $g(\omega)$ based on the obtained relationship. More specifically, embodiment 1 obtains the apparent relaxation time $T_1^*$ corresponding to the specific spin-cavity coupling constant $g(\omega)$ according to the procedure of the following steps 1 to 5.

Forming a plurality of spin-cavity coupling states, which are mutually different in coupling state, is feasible by changing the amount of sample 10.

Step 1 includes calculating spin-cavity coupling constant $g(\omega)$. More specifically, step 1 includes measuring return loss of the cavity 12 serving as a resonance circuit for each magnetic field and calculating spin-cavity coupling constant $g(\omega)$ based on a measured value of the return loss of the cavity 12 and a model-based theoretical value of the return loss of the cavity 12 in a state where the spin-cavity coupling is present. For example, the coupling constant calculation unit 46 can perform calculation for step 1. More specifically, the coupling constant calculation unit 46 calculates spin-cavity coupling constant $g(\omega)$ that minimizes the difference between the actually measured value and the theoretical value.

Step 2 includes changing the amount of sample 10 to N levels and calculating spin-cavity coupling constant $g(\omega)$ for each target amount of sample 10 by applying the processing of step 1. N is an integer not smaller than 1. The calculation in step 2 obtains the spin-cavity coupling constant $g(\omega)$ corresponding to each amount of sample 10; that is, N values of spin-cavity coupling constant $g(\omega)$ that are mutually different in coupling state.

Step 3 includes measuring apparent relaxation time $T_1^*$, for each target of the sample 10 whose amount is changed to N levels, according to a measuring method in which the apparent relaxation time $T_1^*$ does not change during the ESR measurement. More specifically, step 3 includes measuring the apparent relaxation time $T_1^*$ according to a measuring method in which acceleration or deceleration of the relaxation rate does not occur due to a change of the spin-cavity coupling constant $g(\omega)$ during the ESR measurement. The measuring method in which the apparent relaxation time $T_1^*$ does not change (more specifically, the measuring method in which acceleration or deceleration of the relaxation rate does not occur) includes a measuring method in which the apparent relaxation time $T_1^*$ does not change at all (a measuring method in which acceleration or deceleration of the relaxation rate does not occur at all), a measuring method in which the change is not significant, and a measuring method in which the change is very small. The measuring method employed in the first embodiment includes measuring the apparent relaxation time $T_1^*$ according to the perturbative LOT-$T_1$ method (i.e., the p-LOD-T1 method). Measuring each target amount of sample 10 can measure the apparent relaxation time $T_1^*$ corresponding to each amount of sample 10; that is, a total of N values of apparent relaxation time $T_1^*$.

Through the above-mentioned processing of steps 1 to 3, a pair of the spin-cavity coupling constant $g(\omega)$ and the apparent relaxation time $T_1^*$ can be formed for each amount of sample 10; more specifically, for each of mutually different coupling states. As a result, a total of N pairs can be formed. Employing the measuring method in which the apparent relaxation time $T_1^*$ does not change, in step 3, can measure the apparent relaxation time under a constant or substantially constant spin-cavity coupling state (or spin-cavity coupling constant). Therefore, it becomes feasible to associate the spin-cavity coupling constant with the apparent relaxation time.

Step 4 includes fitting quadratic function $F[g(\omega)]$ relating to the relaxation rate depending on the spin-cavity coupling constant to the relationship between the N values of spin-cavity coupling constant $g(\omega)$ and the N values of apparent relaxation rate $R^*(=1/T_1^*)$. For example, the relaxation time calculation unit 48 can perform the fitting processing. Through the processing, the function $F[g(\omega)]$ that represents a relationship between the spin-cavity coupling constant $g(\omega)$ and the apparent relaxation rate $R^*$ can be obtained.

Step 5 includes calculating apparent relaxation rate $R^*$ corresponded to a specific spin-cavity coupling constant $g(\omega)$ using the function $F[g(\omega)]$ subjected to the fitting processing. For example, the relaxation time calculation unit 48 can perform the calculation. Calculating a reciprocal of the relaxation rate $R^*$ can obtain the relaxation time $T_1^*$. Function $F[0]$; i.e., the value of function $F[g(\omega)]$ when the spin-cavity coupling constant $g(\omega)$ is zero (0), indicates a relaxation rate R independent of the spin-cavity coupling constant $g(\omega)$; that is, true relaxation rate R peculiar to the sample 10. A reciprocal of the true relaxation rate R indicates true relaxation time $T_1$ peculiar to the sample 10.

Hereinafter, each step will be described in detail.

Step 1

First, step 1 will be described in detail. Step 1 includes sweeping the microwaves supplied from the microwave oscillator 18 under a certain static magnetic field, in a state where a certain amount of sample 10 is placed in the cavity 12, and further includes measuring the return loss (Q dip, reflection coefficient) of the cavity 12 with the network analyzer 36. Needless to say, it is feasible to calculate the return loss based on a detection result of the voltmeter 38. Step 1 further includes performing similar measurement by changing the intensity of the static magnetic field. Repeating the above-mentioned measurement while changing the intensity of the static magnetic field can obtain the measured value of the return loss of the cavity 12 for each magnetic field; that is, the actually measured data indicating the magnetic field dependency of the return loss.

Figure 3:
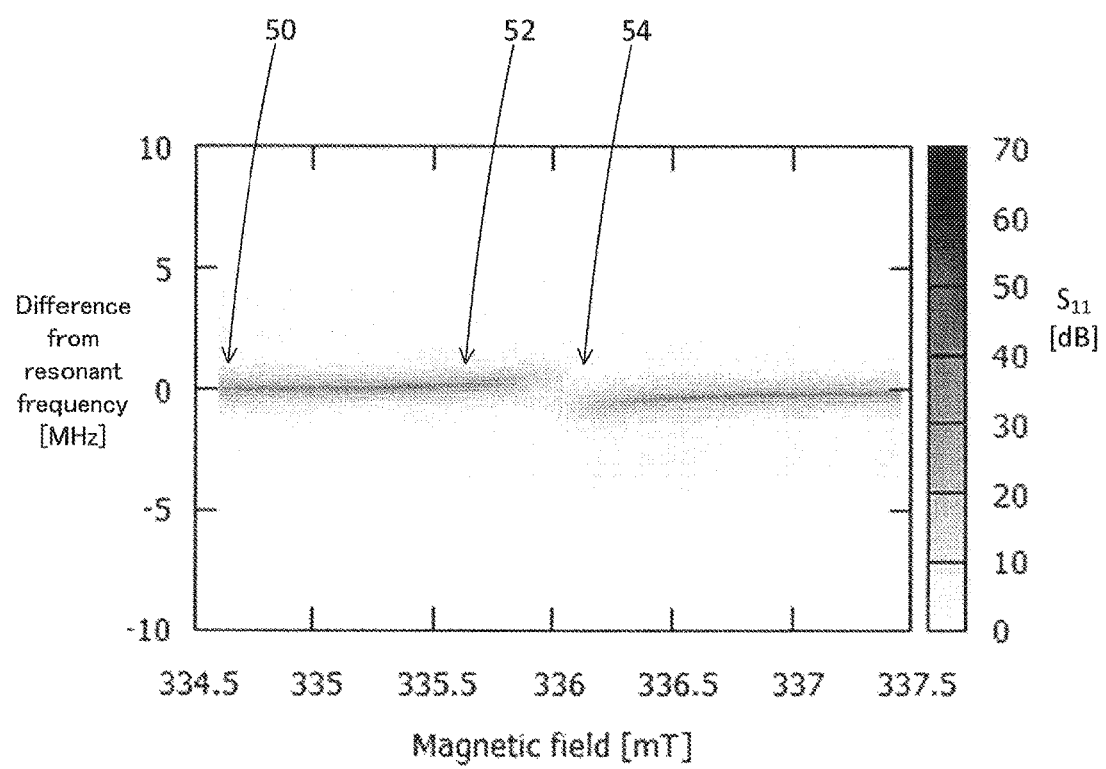
FIG. 3 is a map illustrating magnetic field dependency of return loss of a resonance circuit (e.g., a cavity)

FIG. 3 illustrates a measurement result. The measurement result illustrated in FIG. 3 is a measurement result in a state where a certain amount of sample 10 is placed in the cavity 12 and is an actually measured three-dimensional map indicating the magnetic field dependency of the return loss. In FIG. 3, the horizontal axis indicates the intensity of static magnetic field. The vertical axis indicates the difference $(\omega_0-\omega)$ between resonance frequency $\omega_0$ of the cavity 12 and frequency $\omega$ of the microwaves supplied from the microwave oscillator 18. The shading indicates measured values of the $S_{11}$ parameter of the cavity 12; that is, measured values of the return loss.

Figure 4:
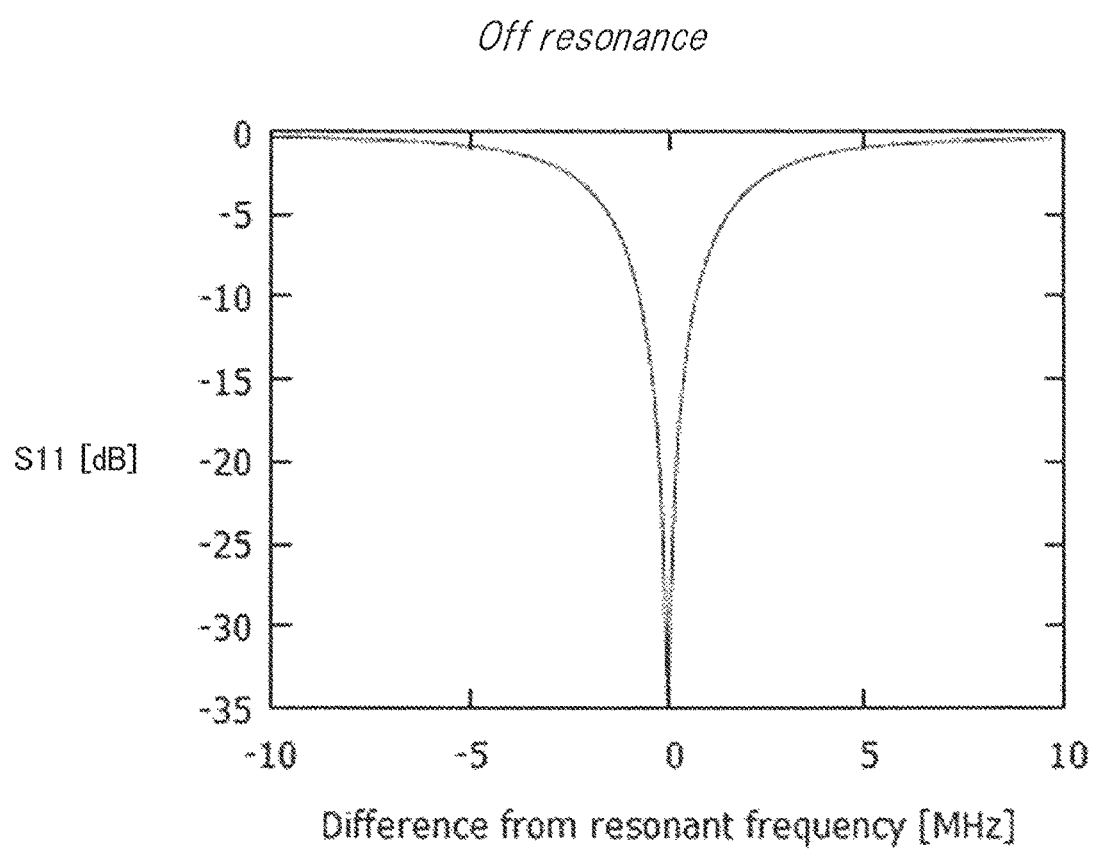
FIG. 4 is a graph illustrating measured values of the return loss of the resonance circuit in an off-resonance state.
Figure 5:
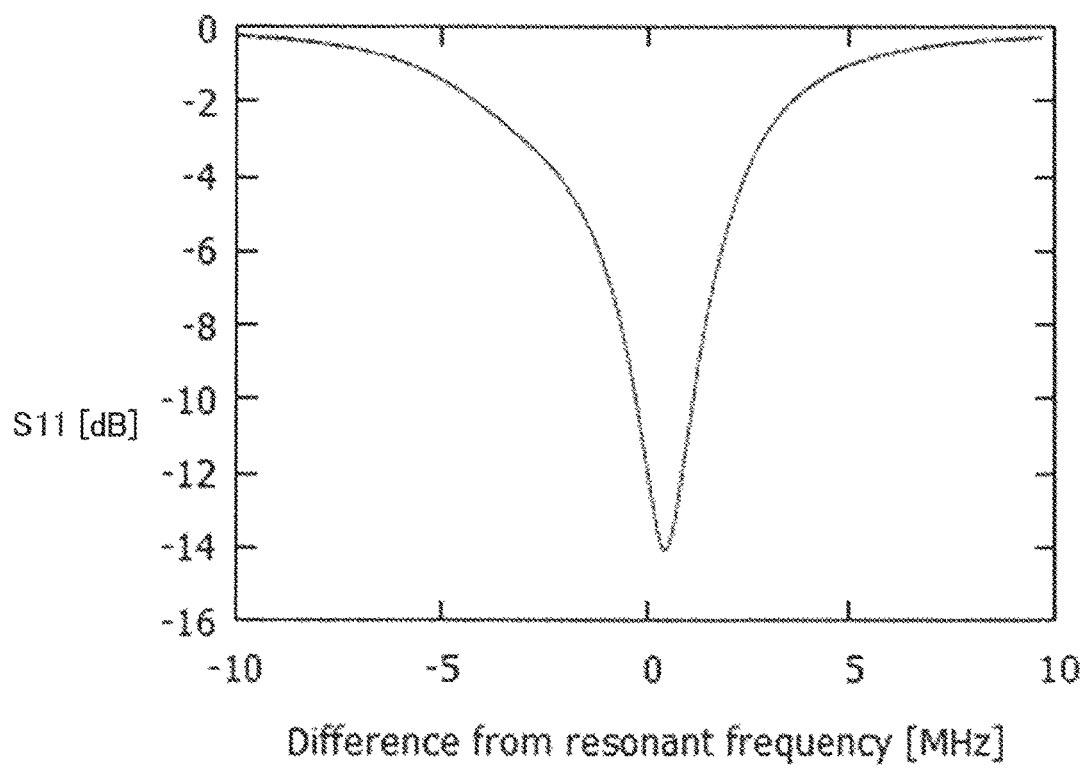
FIG. 5 is a graph illustrating measured values of the return loss of the resonance circuit around resonance.
Figure 6:
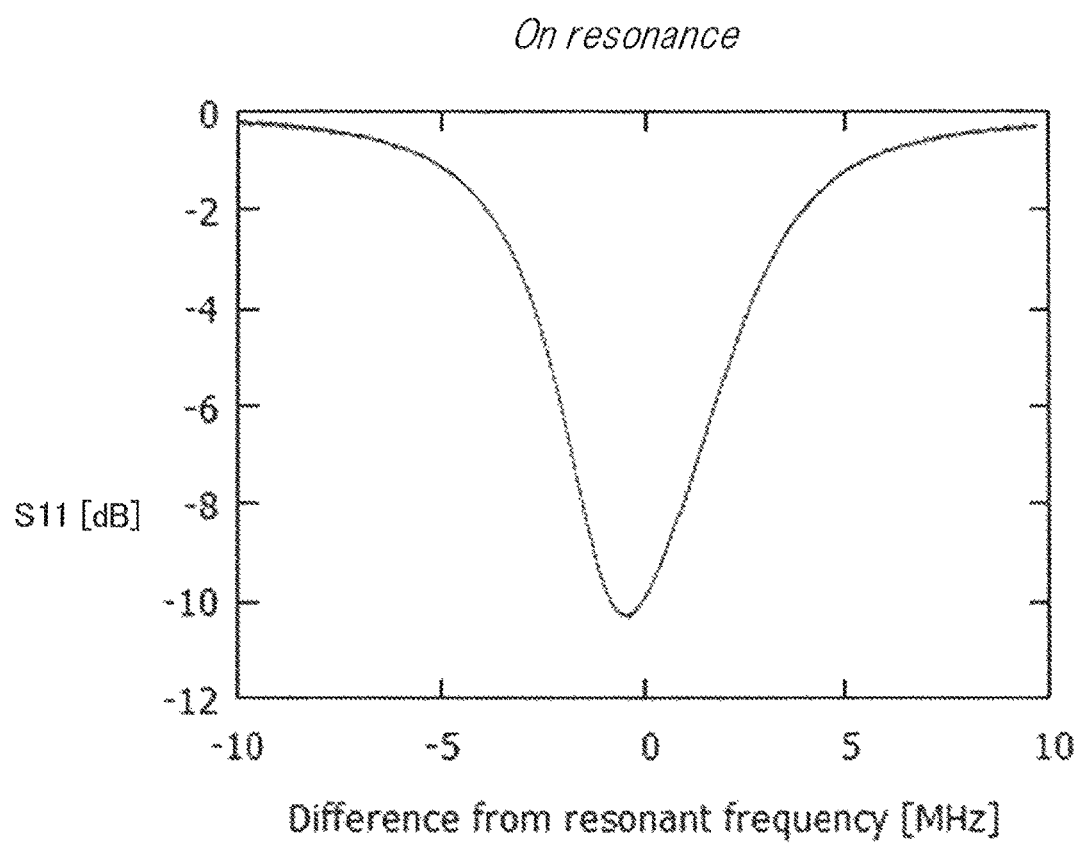
FIG. 6 is a graph illustrating measured values of the return loss of the resonance circuit in an on-resonance state.

FIG. 4 illustrates measured value of the return loss of the cavity 12 in an off-resonance state. The illustrated measured values correspond to the measured values at a portion indicated by reference numeral 50 in FIG. 3. FIG. 5 illustrates measured values of the return loss of the cavity 12 around resonance. The illustrated measured values correspond to the measured values at a portion indicated by reference numeral 52 in FIG. 3. FIG. 6 illustrates measured value of the return loss of the cavity 12 in an on-resonance state. The illustrated measured values correspond to the measured values at a portion indicated by reference numeral 54 in FIG. 3. In each of FIGS. 4 to 6, the horizontal axis indicates the difference $(\omega_0-\omega)$ between resonance frequency $\omega_0$ of the cavity 12 and frequency $\omega$ of the microwaves supplied from the microwave oscillator 18. The vertical axis indicates the measured value of $S_{11}$ parameter of the cavity 12; that is, the measured value of the return loss.

Next, step 1 includes calculating spin-cavity coupling constant $g(\omega)$ based on the measurement result (i.e., the measured values of the return loss) illustrated in FIG. 3 and the model-based theoretical value of the return loss of the cavity 12 (more specifically, the theoretical value of $S_{11}$ parameter) in a state where the spin-cavity coupling is present. The theoretical value of $S_{11}$ parameter can be expressed by the following formula (6).

[Numerical expression 6]

$$|S_{11}| = \left| 1 - \frac{\kappa}{-i(\omega - \omega_c) + \frac{\kappa + \kappa'}{2} - \frac{g^2}{i(\omega - \omega_c) - \frac{\gamma_m}{2}}} \right| \quad (6)$$

Further, a simplified version of formula (6) can be expressed by the following formula (7).

[Numerical expression 7]

$$|S_{11}| = \sqrt{\frac{a^2 + b^2}{c^2 + d^2}} \quad (7)$$

Step 1 further includes fitting the theoretical value of $S_{11}$ parameter defined by the above-mentioned formula (6) (or formula (7)) to the measured value of the return loss illustrated in FIG. 3, and obtaining the spin-cavity coupling constant g(ω) that minimizes the difference between the measured value of the return loss illustrated in FIG. 3 and the theoretical value of $S_{11}$ parameter defined by the above-mentioned formula (6) (or formula (7)).

Step 2

Step 2 includes changing the amount of sample 10 to N levels and applying the processing of step 1 to each target amount of sample 10, thereby obtaining the measured values of the return loss illustrated in FIG. 3 (i.e., actually measured three-dimensional map indicating the magnetic field dependency of return loss) for each amount of sample 10; that is, for each of mutually different coupling states. More specifically, a total of N three-dimensional maps can be obtained. Step 2 further includes fitting the theoretical value of $S_{11}$ parameter defined by the above-mentioned formula (6) (or formula (7)) for each three-dimensional map to obtain the spin-cavity coupling constant g(ω) that minimizes the difference between the measured value of the return loss and the theoretical value of $S_{11}$ parameter. As a result, a total of N values of spin-cavity coupling constant g(ω) can be obtained. More specifically, N values of spin-cavity coupling constant g(ω) that are mutually different in coupling state can be obtained.

Hereinafter, exemplary derivation of the theoretical value of $S_{11}$ parameter defined by the above-mentioned formula (6) will be described.

When a resonance circuit (i.e., a cavity) connected to an electromagnetic wave transmission line, such as a waveguide tube or a coaxial cable, involves a spin system having a spectral resonance frequency similar to the electrical resonance frequency of the cavity, the spin and the cavity produce an opto-mechanical coupling whose constant is the spin-cavity coupling constant g(ω) (see Eisuke Abe, Hua Wu, Arzhang Ardavan, and John J. J. Morton, "Electron spin ensemble strongly coupled to a three-dimensional microwave cavity", Applied Physics Letters 98, 251108 (2011)).

Figures 7, 8:
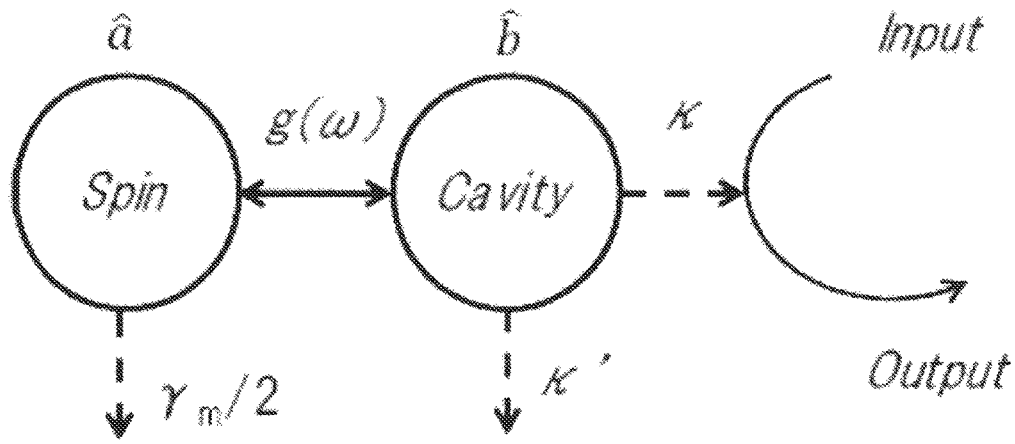
FIG. 7 illustrates a model of a spin-cavity coupling system.
FIG. 8 illustrates various parameters.

FIG. 7 illustrates a model of a spin-cavity coupling system. FIG. 8 illustrates the contents of various parameters. The illustrated model schematically illustrates the flow of energy in a state where electromagnetic energy is injected into a system in which the spin and the cavity coexist. In FIG. 7, "Input" means an input of electromagnetic waves from the transmission line and "Output" means an output of electromagnetic waves reflected (emitted) from the cavity to the transmission path.

Further, κ represents the decay rate of electromagnetic waves emitted from the cavity to the transmission line and κ' represents the decay rate of electromagnetic waves emitted from the cavity to a conductor (e.g., heat bath) of the cavity. In this case, the radiative decay rate of electromagnetic waves is equivalent to Q value on a high-frequency electric circuit, κ corresponds to unloaded Q value ($Q_u$) of the cavity, and κ' corresponds to external Q value ($Q_{ex}$) in a matching circuit. According to high-frequency circuit engineering, the loaded Q value ($Q_L$: actually measured Q value) of the cavity on the transmission line can be expressed by the following formula (8).

[Numerical expression 8]

$$\frac{1}{Q_L} = \frac{1}{Q_u} + \frac{1}{Q_{ex}} \quad (8)$$

The following formula (9) can be obtained by modifying formula (8).

[Numerical expression 9]

$$Q_L = \frac{Q_u}{1 + \frac{Q_u}{Q_{ex}}} \quad (9)$$

A condition for matching in a high-frequency circuit is the state of $Q_u = Q_{ex}$; that is, $Q_L = Q_u/2$, which is generally referred to as "critical coupling." In this case, all the energy of the electromagnetic waves supplied from the transmission line is filled into the resonance circuit and it can be regarded as a non-reflective output state. Accordingly, when the transmission line and the cavity are electrically adjusted to the critical coupling, it can be regarded as $κ=κ'=ω/2Q_L$, because $Q_u=Q_{ex}=2Q_L$.

In FIG. 8, $γ_m/2$ represents the relaxation rate of the spin system. In this case, the relaxation rate of the spin system means a so-called "spin-spin relaxation rate" and the "spin lattice relaxation rate" corresponds to $γ_m$.

In FIG. 8, g(ω) represents the spin-cavity coupling constant, which can be expressed in units of angular values. If a coupling path is produced between the spin and the cavity, the injected energy will be exchanged between them.

In FIG. 8, "a" and "b" (for convenience, denoted by a and b) are generation/annihilation operators of the spin system and the cavity system (i.e., resonator system), respectively.

The Hamiltonian in the spin-cavity system illustrated in FIG. 7 can be described with the following formula (10).

[Numerical expression 10]

$$H = H_{spin} + H_{cavity} + H_I \quad (10)$$

The first term of formula (10) indicates the energy of the spin system and can be described with the following formula (11).

[Numerical expression 11]

$$H_{spin} = \hbar ω_0 â^† â \quad (11)$$

In formula (11), $ω_0$ represents the resonance frequency of the spin system and $a^+a$ (for convenience, denoted as such) represents a number operator.

The second term of formula (10) indicates the energy of the cavity system and can be described with the following formula (12) when $ω_c$ represents the resonance frequency.

[Numerical expression 12]

$$H_{cavity} = \hbar ω_c b̂^† b̂ \quad (12)$$

Spin-resonator interaction $H_I$ can be described with the following formula (13) using its coupling intensity g.

[Numerical expression 13]

$$H_I = -i\hbar g[â^† b̂(ω) - â b̂^†(ω)] \quad (13)$$

The following formulae (14) and (15) can be derived from the Hamiltonian as Heisenberg equations relating to temporal development of "a" and "b" (for convenience, denoted by a and b).

[Numerical expression 14]

$$\dot{\hat{a}} = \frac{i}{\hbar}[H, \hat{a}] = -i\omega_0 \hat{a} - g\hat{b} \tag{14}$$

[Numerical expression 15]

$$\dot{\hat{b}} = \frac{i}{\hbar}[H, \hat{b}] = -i\omega_s \hat{b} - g\hat{a} \tag{15}$$

Heisenberg-Langevin equations can be obtained by adding the dissipation term and the term corresponding to the input/output signal via the transmission line (see C. W. Gardiner and M. J. Collett "Input and output in damped quantum systems: Quantum stochastic differential equations and the master equation", Physical Review A, Vol. 31, No. 6, 3761(1985)).

The Heisenberg-Langevin equations of the spin-cavity system can be expressed by the following formulae (16) and (17) (see "Laser Cooling and Optical Detection of Excitations in a LC Electrical Circuit", J. M. Taylor, A. S. Sorensen, C. M. Marcus, and E. S. Polzik PHYSICAL REVIEW LETTERS, 107, 273601(2011)).

[Numerical expression 16]

$$\dot{\hat{a}} = -i\omega_0 \hat{a} - \frac{\gamma_m}{2}\hat{a} - ig\hat{b} \tag{16}$$

[Numerical expression 17]

$$\dot{\hat{b}} = -i\omega_c \hat{b} - \frac{\kappa + \kappa'}{2}\hat{b} - ig\hat{a} - \sqrt{\kappa}\,\hat{b}_{in} \tag{17}$$

In the above-mentioned equations, "a" (for convenience, denoted by a) represents a harmonic oscillator operator associated with a spin group. Further, "b" (for convenience, denoted by b) represents a harmonic oscillator operator describing the cavity. Further, $b_{in}$ (for convenience, denoted by $b_{in}$) represents the input signal transmitted from the transmission line to the cavity. Assuming that $b_{out}$ (for convenience, denoted by $b_{out}$) represents its response; namely, the output signal from the cavity, a relationship expressed by the following formula (18) is established for the input and the output (input/output theorem).

[Numerical expression 18]

$$\hat{b}_{out} = \hat{b}_{in} + \sqrt{\kappa}\,\hat{b} \tag{18}$$

The $S_{11}$ parameter is a ratio of reflection and incidence and can be expressed by the following formula (19) based on formula (18).

[Numerical expression 19]

$$S_{11} \equiv \left|\frac{\hat{b}_{out}}{\hat{b}_{in}}\right| = \left|1 + \sqrt{\kappa}\,\frac{\hat{b}}{\hat{b}_{in}}\right| \tag{19}$$

In measuring the frequency ($\omega$) dependency of the $S_{11}$ parameter, a measurement device demodulates a response signal of a measurement target using a reference signal of the frequency $\omega$. Accordingly, it is necessary to convert the Heisenberg-Langevin equation into the display in a rotational coordinate system of the frequency $\omega$. The following formulae (20) and (21) express the converted equations.

[Numerical expression 20]

$$\dot{\hat{a}} = \left[i(\omega - \omega_0) - \frac{\gamma_m}{2}\right]\hat{a} - ig\hat{b} \tag{20}$$

[Numerical expression 21]

$$\dot{\hat{b}} = \left[i(\omega - \omega_c) - \frac{\kappa + \kappa'}{2}\right]\hat{b} - ig\hat{a} - \sqrt{\kappa}\,\hat{b}_{in} \tag{21}$$

Further, because the measurement of $S_{11}$ parameter includes continuously irradiation of microwaves and measurement of reflected microwaves, the system is in a steady state and the following formulae (22) and (23) can be obtained when the time differentiation is zero (0) in formulae (20) and (21).

[Numerical expression 22]

$$\hat{a} = ig\left[i(\omega - \omega_0) - \frac{\gamma_m}{2}\right]^{-1}\hat{b} \tag{22}$$

[Numerical expression 23]

$$\left\{\left[i(\omega - \omega_c) - \frac{\kappa + \kappa'}{2}\right] + g^2\left[i(\omega - \omega_0) - \frac{\gamma_m}{2}\right]^{-1}\right\}\hat{b} = \sqrt{\kappa}\,\hat{b}_{in} \tag{23}$$

When formulae (19) and (23) are used, the $S_{11}$ parameter can be expressed by the following formula (24).

[Numerical expression 24]

$$|S_{11}| = \left|1 - \frac{\kappa}{-i(\omega - \omega_c) + \frac{\kappa + \kappa'}{2} - \frac{g^2}{i(\omega - \omega_c) - \frac{\gamma_m}{2}}}\right| \tag{24}$$

Accordingly, the above-mentioned formula (6) can be derived.

Developing the above-mentioned formula (24)(i.e., formula (6)) can express the $S_{11}$ parameter by the following formula (25). Further, developing formula (25) can express the $S_{11}$ parameter by the following formula (26).

[Numerical expression 25]

$$S_{11} = 1 + \frac{\kappa}{i(\omega - \omega_c) - \frac{\kappa + \kappa'}{2} + \frac{-\frac{\gamma_m}{2}g^2}{\frac{\gamma_m^2}{4} + (\omega - \omega_0)^2} - i\frac{g^2(\omega - \omega_0)}{\frac{\gamma_m^2}{4} + (\omega - \omega_0)^2}} \tag{25}$$

-continued

[Numerical expression 26]

$$= 1 + \frac{\kappa}{-\frac{\gamma_m}{2}g^2 - \frac{\kappa+\kappa'}{2} + i\left[(\omega-\omega_0) - \frac{g^2(\omega-\omega_0)}{\frac{\gamma_m^2}{4}+(\omega-\omega_0)^2}\right]} \quad (26)$$

Simplifying formula (26) can express the $S_{11}$ parameter by the following formula (27).

[Numerical expression 27]

$$= 1 + \frac{\kappa}{c+id} = \frac{c+\kappa+id}{c+id} = \frac{a+ib}{c+id} \quad (27)$$

Accordingly, the $S_{11}$ parameter can be expressed by the following formula (28).

[Numerical expression 28]

$$|S_{11}| = \sqrt{\frac{a^2+b^2}{c^2+d^2}} \quad (28)$$

Thus, the above-mentioned formula (7) can be derived.

Figure 9:
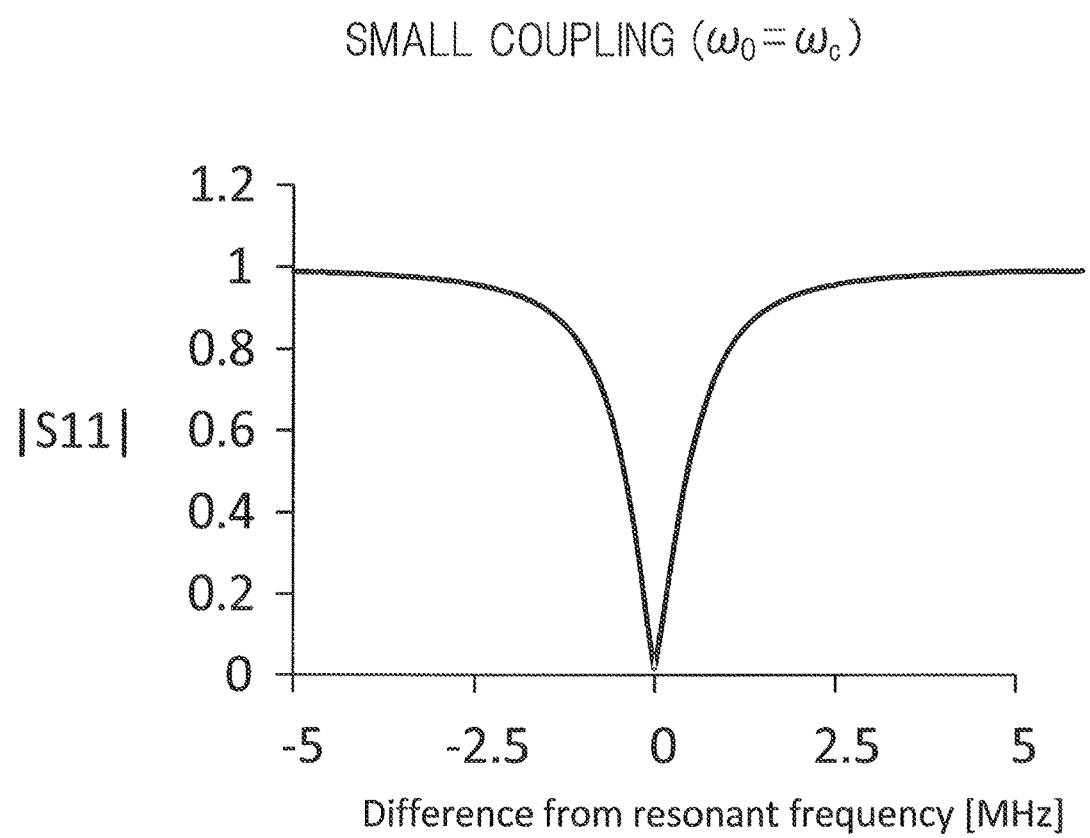
FIG. 9 illustrates theoretical values of $S_{11}$ parameter when the spin-cavity coupling is smaller.
Figure 10:
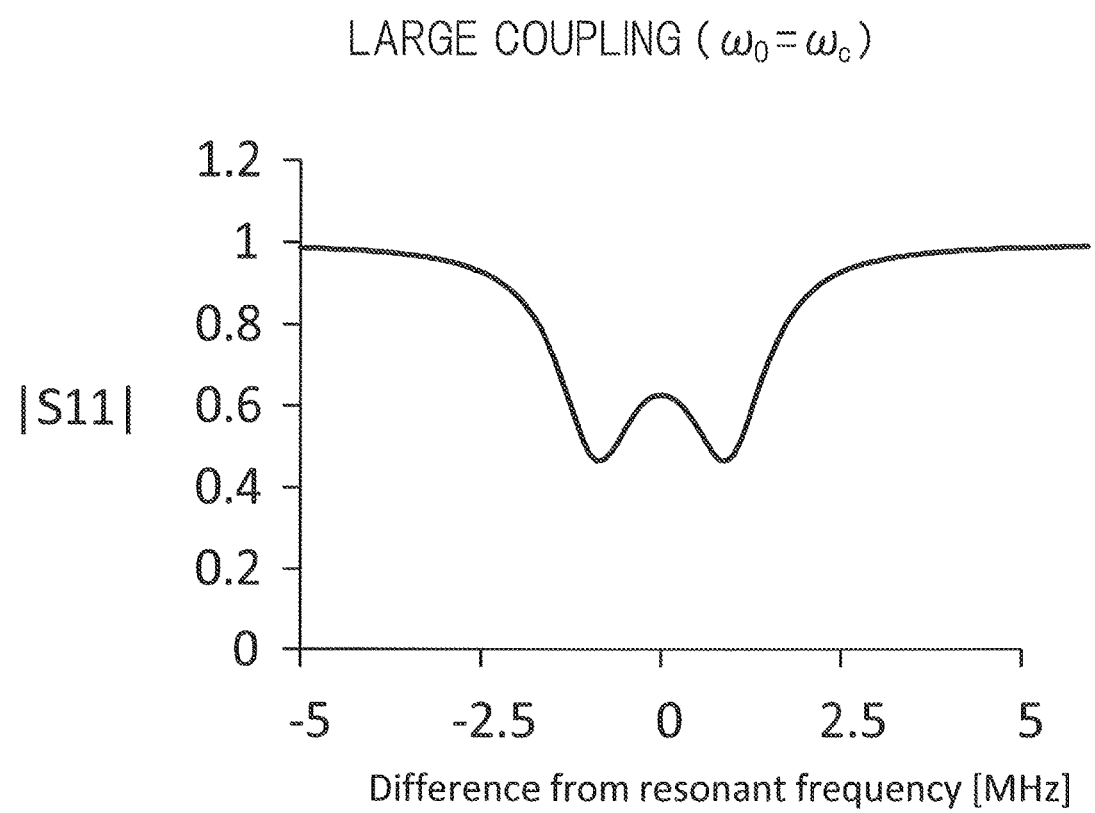
FIG. 10 illustrates theoretical values of $S_{11}$ parameter when the spin-cavity coupling is larger.

FIGS. 9 and 10 illustrate exemplary theoretical values of the $S_{11}$ parameter (i.e., the values obtained from formula (6)) in the on-resonance state. FIG. 9 illustrates theoretical values of the $S_{11}$ parameter when the spin-cavity coupling is smaller. FIG. 10 illustrates theoretical values of the $S_{11}$ parameter when the spin-cavity coupling is larger.

In formula (6), κ and κ' are parameters obtainable from the measurement in the off-resonance state. Further, $\gamma_m/2$ is a parameter obtainable from the apparent spectrum. For example, $\gamma_m/2$ can be used as a half width of the apparent spectrum. Step 2 includes changing the amount of sample 10 to N levels and measuring κ, κ', and $\gamma_m/2$ for each sample amount. Step 2 further includes substituting the measured parameters into the theoretical formula (i.e., formula (6)) of the $S_{11}$ parameter, fitting the theoretical formula to the measured value of the return loss for each sample amount, and obtaining spin-cavity coupling constant g(ω) that minimizes the difference between the measured value of the return loss and the theoretical value of $S_{11}$ parameter. Therefore, the spin-cavity coupling constant g(ω) can be obtained for each sample amount. More specifically, a total of N values of spin-cavity coupling constant g(ω) that are mutually different in coupling state can be obtained.

Alternatively, the spin-cavity coupling constant g(ω) can be obtained by fitting the theoretical value of $S_{11}$ parameter, for example, in the on-resonance state to the measured value of the return loss, instead of performing the fitting for all of the measured values of the return loss.

Step 3

Step 3 includes measuring apparent relaxation time $T_1^*$, for each target of the sample 10 whose amount is changed to N levels, according to a measuring method in which the apparent relaxation time $T_1^*$ does not change during the ESR measurement (more specifically, a measuring method in which acceleration or deceleration of the relaxation rate does not occur due to a change in the spin-cavity coupling constant g(ω) during the ESR measurement). The perturbative LOT-$T_1$ method (i.e., the p-LOD-T1 method) is employed in the first embodiment to measure the apparent relaxation time $T_1^*$ corresponding to each amount of sample 10. As a result, a total of N values of apparent relaxation time $T_1^*$ can be obtained.

Hereinafter, an acceleration effect of the relaxation rate will be described. As discussed in Eisuke Abe, Hua Wu, Arzhang Ardavan, and John J. L. Morton, "Electron spin ensemble strongly coupled to a three-dimensional microwave cavity", Applied Physics Letters 98, 251108(2011), it is known that the spin-cavity coupling constant g(ω) is proportional to the square root of the number of spins in the spin system. More specifically, it can be construed as possessing a certain spin-cavity coupling constant while interacting with the cavity, as long as the number of spins participating in the resonance is constant. On the other hand, the spin-cavity coupling constant will vary if the number of spins increases or decreases during resonance.

In the inversion recovery method and the saturation recovery method, if the spin system receives strong pulse modulation when the magnetization in the initial state is $M_0$, the magnetization changes greatly from the initial value to, for example, $-M_0$ or zero (0) upon turning off of the pulse irradiation. When the pulse irradiation is turned off, the magnetization changes with elapsed time and approaches the equilibrium magnetization $M_0$ in the initial state.

The amount of magnetization is proportional to the product of the magnitude of the magnetic moment of the spin and the number of spins. Accordingly, the change in the magnetization value with elapsed time means that the number of spins participating in the resonance is changing. It is predicted that the spin-cavity coupling constant will increase or decrease in proportion to the square root of the magnetization with elapsed time, if the number of spins changes with elapsed time.

In the relaxation process of the spin system, if the spin-cavity coupling constant g(ω) changes with elapsed time, the relaxation curve will not be a simple exponential function. In this case, as the measurement cannot be performed under the condition of fixed spin-cavity coupling constant g(ω), it is unfeasible to accurately measure the relaxation rate under the condition of constant spin-cavity coupling constant g(ω). This is referred to as the acceleration effect of the relaxation rate in the spin-cavity coupling state. Avoiding this is feasible by measuring the relaxation rate (i.e., relaxation time) according to a measuring method in which the magnetization value is not largely offset from the equilibrium magnetization value in the resonance state. The measuring method employed in the first embodiment is the perturbative LOT-$T_1$ method (i.e., the p-LOD-T1 method). Therefore, the apparent relaxation time $T_1^*$ can be measured in a state where acceleration or deceleration of the relaxation rate does not occur. As described below, a measuring method employed in the second embodiment is the frequency swept longitudinal detection method (the fs-LOD method). Therefore, the apparent relaxation time $T_1^*$ can be measured in the state where acceleration or deceleration of the relaxation rate does not occur.

Through the processing of steps 1 to 3, a pair of the spin-cavity coupling constant g(ω) and the apparent relaxation time $T_1^*$ can be formed for each amount of sample 10. As a result, a total of N pairs can be formed.

Step 4

Figure 11:
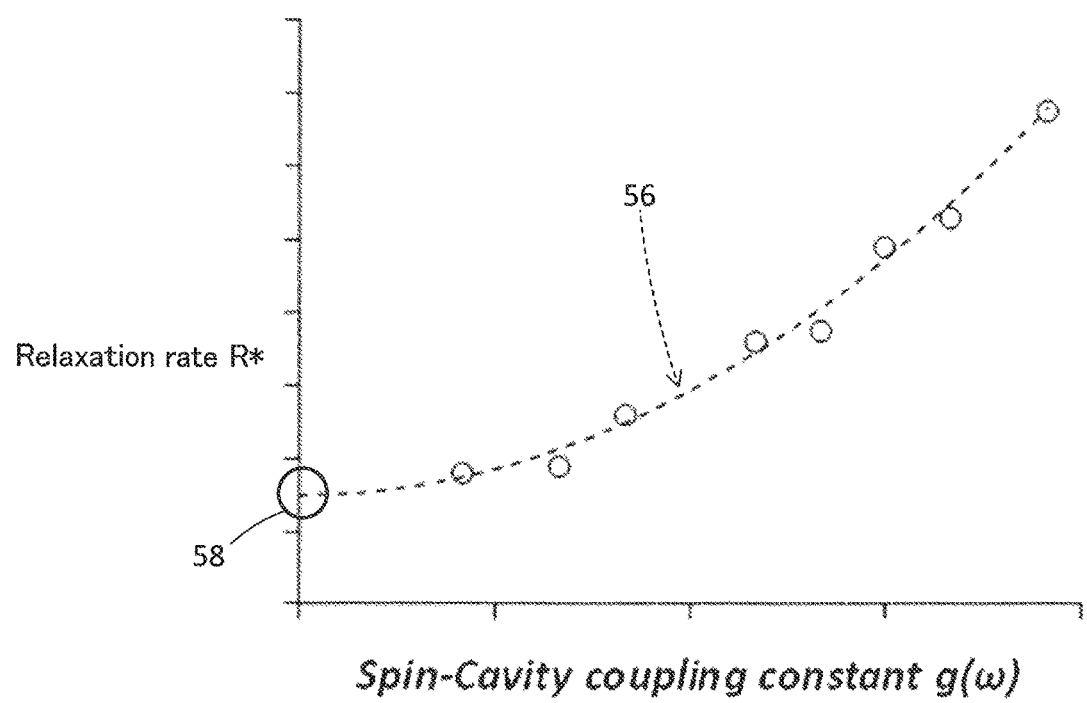
FIG. 11 is a graph illustrating relaxation rate with respect to spin-cavity coupling constant.

Step 4 includes plotting apparent relaxation rates $R^*(=1/T_1^*)$ corresponding to the measured N values of spin-cavity coupling constant g(ω). FIG. 11 illustrates an exemplary graph created by the plotting. In the illustrated graph, the horizontal axis indicates the measured spin-cavity coupling constant g(ω) and the vertical axis indicates the measured apparent relaxation rate R*(=1/T$_1$*).

Step 4 further includes fitting quadratic function F[g(ω)] relating to the relaxation rate depending on the spin-cavity coupling constant g(ω) to the graph formed by plotting. The fitting processing can obtain function F[g(ω)] representing the relationship between the spin-cavity coupling constant g(ω) and apparent relaxation rate R*. Function 56 illustrated in FIG. 11 corresponds to the obtained function F[g(ω)].

Hereinafter, the reason for the quadratic function curve relating to the relaxation rate will be described.

It is now assumed that an ensemble group of N pieces of spin I=½ particles is placed in a magnetic field B$_0$. In this case, marcoscopic magnetization M$_0$ can be expressed by the following formula (29).

[Numerical expression 29]

$$M_0 = \mu \Delta n \quad (29)$$

In formula (29), μ represents the magnetic moment of a single spin and can be expressed by the following formula (30) using magnetic rotation ratio γ.

[Numerical expression 30]

$$\mu = \gamma \hbar I = \tfrac{1}{2}\gamma \hbar \quad (30)$$

Δn represents difference in distribution to Zeeman energy ranking and can be expressed by the following formula (31) using spin polarization factor P.

[Numerical expression 31]

$$\Delta n = NP \quad (31)$$

In thermal equilibrium at temperature T, P can be expressed by the following formula (32).

[Numerical expression 32]

$$P = \tanh\left(\frac{\hbar \omega_0}{2k_B T}\right) \quad (32)$$

In formula (32), ω$_0$=γB$_0$ represents Larmor precession movement frequency and k$_B$ represents Boltzmann's constant.

When the eigenmode of microwaves (radio waves) common to the spin ensemble system is applied, the system effectively behaves as a pseudo single spin having angular momentum J=ΔnI, whose state can be expressed using the eigenstate |r, m> (see R. H. Dicke, Coherence in Spontaneous Radiation Processes. Physical Review, 93, 99-110 (1954)). In the above description, r and m are simultaneous eigenvalues of J$^2$ and J$_z$, and m has a relationship expressed by the following formula (33) with the difference in the distribution of collective spins.

[Numerical expression 33]

$$2m = -\Delta n \quad (33)$$

Further, r is referred to as "cooperation number" and can take any value in a range defined by the following formula (34).

[Numerical expression 34]

$$|m| \leq r \leq \frac{N}{2} \quad (34)$$

When n>>1 and the temperature is so high that the condition expressed by the following formula (35) can be satisfied, the state with minimum r has high weight statistical-mechanically. As a result, the system settles in the aggregation state of r=|m| in the thermodynamic equilibrium state.

[Numerical expression 35]

$$n \gg |m| \sim \frac{n\hbar}{4kT} \quad (35)$$

According to Holstein and Primakoff, the collective spin state can be associated with a harmonic oscillator of number eigenvalue n=r−m (see T. Holstein, H. Primakoff, Field dependence of the intrinsic domain magnetization of a ferromagnet. Physical Review, 58, 1098-1113(1940)). Using the boson generation/annihilation operator {a$^+$,a} (for convenience, denoted by a) and the number operator n=a$^+$a (for convenience, denoted as such) can express each element of the collective spin operator by the following formulae (36), (37), and (38).

[Numerical expression 36]

$$\hat{J}_+ = \hbar(\sqrt{2r-\hat{n}})\hat{a} \quad (36)$$

[Numerical expression 37]

$$\hat{J}_- = \hbar \hat{a}^\dagger \sqrt{2r-\hat{n}} \quad (37)$$

[Numerical expression 38]

$$\hat{J}_z = \hbar(r - \hat{n}) \quad (38)$$

Further, the exchange relationship can be expressed by the following formulae (39), (40), and (41).

[Numerical expression 39]

$$[\hat{a},\hat{a}^\dagger] = 1 \quad (39)$$

[Numerical expression 40]

$$[\hat{n},\hat{a}] = -\hat{a} \quad (40)$$

[Numerical expression 41]

$$[\hat{n},\hat{a}^\dagger] = \hat{a}^\dagger \quad (41)$$

Then, an expected value of the number operator can be expressed by the following formula (42).

[Numerical expression 42]

$$\langle \hat{n} \rangle = \langle \hat{a}^\dagger \hat{a} \rangle = r - m \quad (42)$$

From the viewpoint of mean field theory, formulae (36), (37), and (38) can be approximated as a$^+$a~<a$^+$a> (for convenience, denoted by a$^+$a). Then, J$_+$ and J$_−$ (for convenience, the operators are denoted by J$_+$ and J$_−$) are zero (0) in the thermal equilibrium (r=−m), and <Jz>~h/2π·m correspond to (h/4π) times the difference in distribution. Further, h is Planck's constant and h/2π is reduced Planck's constant (Dirac's constant). On the other hand, when a thermal equilibrium system is irradiated with π/2 pulse to make m=0, $J_z$ (for convenience, the operator is denoted by $J_z$) becomes zero while respective operators can be expressed by the following formulae (43) and (44).

[Numerical expression 43]

$$\hat{J}_+ = \hbar\sqrt{r}\hat{a} \qquad (43)$$

[Numerical expression 44]

$$\hat{J}_- = \hbar\sqrt{r}\hat{a}^\dagger \qquad (44)$$

Accordingly, when the collective spin system is in the thermal equilibrium state, when there is no or smaller transverse magnetization, the system behaves as a harmonic oscillator within the time comparable to decoherence time ($T_2$) immediately after the π/2 pulse.

In summary, the transverse magnetization is associated with the harmonic oscillator operator "a" (for convenience, denoted as a). Further, the vertical magnetization relates to the number operator $a^+a$ (for convenience, denoted as such).

Heisenberg-Langevin equations of the spin system "a" and the cavity system "b" (for convenience, denoted by a and b) in the spin-cavity coupling model illustrated in FIG. 7 can be expressed by the following formulae (45) and (46).

[Numerical expression 45]

$$\dot{\hat{a}} = -i\omega_0\hat{a} - \frac{\gamma_m}{2}\hat{a} - ig\hat{b} \qquad (45)$$

[Numerical expression 46]

$$\dot{\hat{b}} = -i\omega_c\hat{b} - \frac{\kappa+\kappa'}{2}\hat{b} - ig\hat{a} - \sqrt{\kappa}\,\hat{b}_{in} \qquad (46)$$

In the above formulae, $\omega_0$ represents the resonance frequency of the spin system and $\omega_c$ represents the resonance frequency of the cavity. G has the same meaning as g(ω).

The number operator $a^+a$ (for convenience, denoted as such) can be regarded as an operator that outputs a deviation amount from the vertical magnetization component in the equilibrium state.

The following formula (47) is an equation of motion of the number operator $a^+a$ (for convenience, denoted as such) derived from the above-mentioned Heisenberg-Langevin equation (formula (45)).

[Numerical expression 47]

$$\frac{d}{dt}(\hat{a}^\dagger\hat{a}) = \dot{\hat{a}}^\dagger\hat{a} + \hat{a}^\dagger\dot{\hat{a}}, \qquad (47)$$
$$= \left(i\omega_0\hat{a}^\dagger - \frac{\gamma_m}{2}\hat{a}^\dagger + ig\hat{b}^\dagger\right)\hat{a} + \hat{a}^\dagger\left(-i\omega_0\hat{a} - \frac{\gamma_m}{2}\hat{a} - ig\hat{b}\right)$$
$$= -\gamma_m\hat{a}^\dagger\hat{a} - ig(\hat{a}^\dagger\hat{b} - \hat{b}^\dagger\hat{a})$$

The following formula (48) is established in a state where the irradiation of microwaves is terminated; more specifically, in the steady state of the operator "b" (for convenience, denoted by b) on the cavity side (namely, the time differentiation of the operator b is zero (0) and operator $b_{in}=0$).

[Numerical expression 48]

$$\hat{b} = \frac{ig\hat{a}}{\left[i(\omega-\omega_c) - \frac{\kappa+\kappa'}{2}\right]} \qquad (48)$$

The following formulae (49) and (50) are established in the on-resonance state.

[Numerical expression 49]

$$\hat{b} = -\frac{ig}{\frac{\kappa+\kappa'}{2}}\hat{a} \qquad (49)$$

[Numerical expression 50]

$$\hat{b}^\dagger = \frac{ig}{\frac{\kappa+\kappa'}{2}}\hat{a}^\dagger \qquad (50)$$

The following formula (51) can be derived from formulae (47) and (48).

[Numerical expression 51]

$$\frac{d}{dt}(\hat{a}^\dagger\hat{a}) = -\gamma_m\hat{a}^\dagger\hat{a} - ig(\hat{a}^\dagger\hat{b} - \hat{b}^\dagger\hat{a}), \qquad (51)$$
$$= -\gamma_m\hat{a}^\dagger\hat{a} - \frac{g^2}{(\kappa+\kappa')/2}\hat{a}^\dagger\hat{a} - \frac{g^2}{(\kappa+\kappa')/2}\hat{a}^\dagger\hat{a}$$
$$= -\left(\gamma_m + \frac{4g^2}{\kappa+\kappa'}\right)\hat{a}^\dagger\hat{a}$$
$$= -\gamma_m(1+C)\hat{a}^\dagger\hat{a}$$

C can be expressed by the following formula (52).

[Numerical expression 52]

$$C = \frac{4g^2}{(\kappa+\kappa')\gamma_m} \qquad (52)$$

The following formula (53) can be derived when the above equation is solved.

[Numerical expression 53]

$$\hat{a}^\dagger\hat{a} = e^{-\gamma_m(1+C)t} \qquad (53)$$

Accordingly, it is understood that the number operator $a^+a$ (for convenience, denoted as such) expressing the degree of deviation from the equilibrium magnetization has the nature of recovering to the equilibrium state at the relaxation rate of time constant $\gamma_m(1+C)$.

When R* represents the apparent relaxation rate, R* can be expressed by the following formula (54) according to formula (53).

[Numerical expression 54]

$$R^* = \gamma_m(1+C) \qquad (54)$$

When the spin-cavity coupling is not present, C=0 and the true relaxation rate R can be observed as a value expressed by the following formula (55).

[Numerical expression 55]

$$R = \gamma_m = \frac{1}{T_1} \quad (55)$$

On the other hand, in a state where the spin-cavity coupling is present, the apparent relaxation rate will be observed as a value faster than the true value, due to the effect of C, because it is proportional to the square of the spin-cavity coupling constant $g(\omega)$, as is apparent from formulae (51) and (52).

In summary, the apparent relaxation rate $R^*(=1/T_1^*)$ can be expressed by the following formula (56). In this manner, the apparent relaxation rate * can be expressed as a quadratic function of the spin-cavity coupling constant $g(\omega)$.

[Numerical expression 56]

$$\frac{1}{T_1^*} = \frac{1}{T_1}\left(1 + \frac{4g^2}{(\kappa+\kappa')T_1}\right) \quad (56)$$

Step 5

Step 5 includes obtaining relaxation rate $R^*$ (namely, relaxation time $T_1^*$) corresponding to arbitrary spin-cavity coupling constant $g(\omega)$ using the function $F[g(\omega)]$ obtained through the fitting of step 4. Referring back to FIG. 11, the function 56 can be used to obtain the relaxation rate $R^*$ corresponding to the arbitrary spin-cavity coupling constant $g(\omega)$. For example, the relaxation rate (value $F[0]$) when $g(\omega)=0$ is a relaxation rate independent of $g(\omega)$; namely, the true relaxation rate. Accordingly, the reciprocal of the true relaxation rate corresponds to the true relaxation time $T_1$ peculiar to the sample.

As mentioned above, according to embodiment 1 of the first embodiment, N spin-cavity coupling states that are mutually different in coupling state can be intentionally formed by changing the amount of sample 10 to N levels and the relationship between the spin-cavity coupling constant $g(\omega)$ and the apparent relaxation time $T_1^*$ can be obtained. In this case, applying the perturbative LOT-$T_1$ method (i.e., the p-LOD-T1 method) can measure apparent relaxation time free from acceleration or deceleration of the relaxation rate and can measure spin-cavity coupling constant $g(\omega)$ corresponding to constant relaxation rate. According to embodiment 1, it is feasible to obtain the true relaxation time $T_1$ peculiar to the sample even when the spin-cavity coupling appears. Further, as $g(\omega)$ corresponding to the apparent relaxation time $T_1^*$ can be known from the function $F[g(\omega)]$, controlling the apparent relaxation time $T_1^*$ is feasible by controlling $g(\omega)$.

Embodiment 2

Hereinafter, a relaxation time measuring method according to embodiment 2 will be described. The method according to embodiment 2 includes measuring apparent relaxation time $T_1^*$ according to the perturbative LOT-$T_1$ method (i.e., the p-LOD-T1 method) while changing the Q value of cavity 12, obtaining a relationship between the spin-cavity coupling constant $g(\omega)$ and the apparent relaxation time $T_1^*$, and obtaining apparent relaxation time $T_1^*$ corresponding to specific spin-cavity coupling constant $g(\omega)$ based on the obtained relationship. More specifically, embodiment 2 obtains the apparent relaxation time $T_1^*$ corresponding to the specific spin-cavity coupling constant $g(\omega)$ according to the procedure of the following steps 1 to 5.

Changing the Q value of cavity 12 can form a plurality of spin-cavity coupling constants that are mutually different in coupling state.

Step 1 includes calculating spin-cavity coupling constant $g(\omega)$. Similar to the above-mentioned embodiment 1, step 1 includes measuring the return loss of the cavity 12 and calculating spin-cavity coupling constant $g(\omega)$ that minimizes the difference between the measured value and the theoretical value (formula (6)).

Step 2 includes changing the Q value of cavity 12 to N levels and calculating spin-cavity coupling constant $g(\omega)$ by applying the processing of step 1 at each stage. Similar to the above-mentioned embodiment 1, step 2 includes measuring $\kappa$, $\kappa'$, and $\gamma_m/2$ in formula (6). Embodiment 2 changes the Q value of cavity 12 to N levels and measures $\kappa$, $\kappa'$, and $\gamma_m/2$ for respective Q values, and obtains spin-cavity coupling constant $g(\omega)$ that minimizes the difference between the measured value of the return loss and the theoretical value of $S_{11}$ parameter by substituting the measured parameters into the theoretical formula (formula (6)) of the $S_{11}$ parameter and fitting the theoretical formula to the measured value of the return loss, for respective Q values. Therefore, the spin-cavity coupling constant $g(\omega)$ can be obtained for each Q value. More specifically, a total of N values of spin-cavity coupling constant $g(\omega)$ that are mutually different in coupling state can be obtained. The following method is employable as an exemplary method for changing the Q value of the cavity 12. For example, it is feasible to change the Q value of cavity 12 to N levels by changing the amount of substance, such as water, placed in the cavity 12 to N levels. As another example, it is feasible to obtain a Q value corresponding to the degree of substance insertion into the cavity 12 by partly inserting or removing the substances in or out of the cavity 12. A motor can be employed to perform the work for inserting or removing the substance so that the Q value can be automatically changed. The configuration for automatically changing the Q value corresponds to an example of the forming unit.

Step 3 includes measuring apparent relaxation time $T_1^*$ according to the perturbative LOT-$T_1$ method (i.e., the p-LOD-T1 method) for each sample 10 having a target Q value changed to N levels and disposed in the cavity 12. Performing the measurement for each sample 10 having the target Q value and disposed in the cavity 12 can measure the apparent relaxation time $T_1^*$ for each Q value. More specifically, a total of N values of apparent relaxation time $T_1^*$ that are mutually different in coupling state can be measured.

Through the above-mentioned processing of steps 1 to 3, a pair of the spin-cavity coupling constant $g(\omega)$ and the apparent relaxation time $T_1^*$ can be formed for each Q value of cavity 12. As a result, a total of N pairs can be formed. Employing the measuring method in which the apparent relaxation time $T_1^*$ does not change, in step 3, can measure the apparent relaxation time under a constant or substantially constant spin-cavity coupling state (or spin-cavity coupling constant). Therefore, it becomes feasible to associate the spin-cavity coupling constant with the apparent relaxation time.

Similar to embodiment 1, step 4 includes fitting a quadratic function $F[g(\omega)]$ relating to the relaxation rate depending on the spin-cavity coupling constant to the relationship between the N values of spin-cavity coupling constant $g(\omega)$ and the N values of apparent relaxation rate $R^*(=1/T_1^*)$. The fitting processing can obtain function $F[g(\omega)]$ representing the relationship between the spin-cavity coupling constant $g(\omega)$ and the apparent relaxation rate R.

Similar to embodiment 1, step 5 includes calculating apparent relaxation rate $R^*$ corresponding to specific spin-cavity coupling constant $g(\omega)$ using the function $F[g(\omega)]$ subjected to the fitting processing. Calculating the value of $F[0]$; i.e., the value of function $F[g(\omega)]$ when the spin-cavity coupling constant $g(\omega)$ is zero (0), can obtain true relaxation rate R; namely, true relaxation time $T_1$.

As mentioned above, even in embodiment 2 of the first embodiment, the relationship between the spin-cavity coupling constant $g(\omega)$ and the apparent relaxation time $T_1^*$ can be obtained and it is feasible to obtain the true relaxation time $T_1$ peculiar to the sample even when the spin-cavity coupling appears.

Second Embodiment

Figure 12:
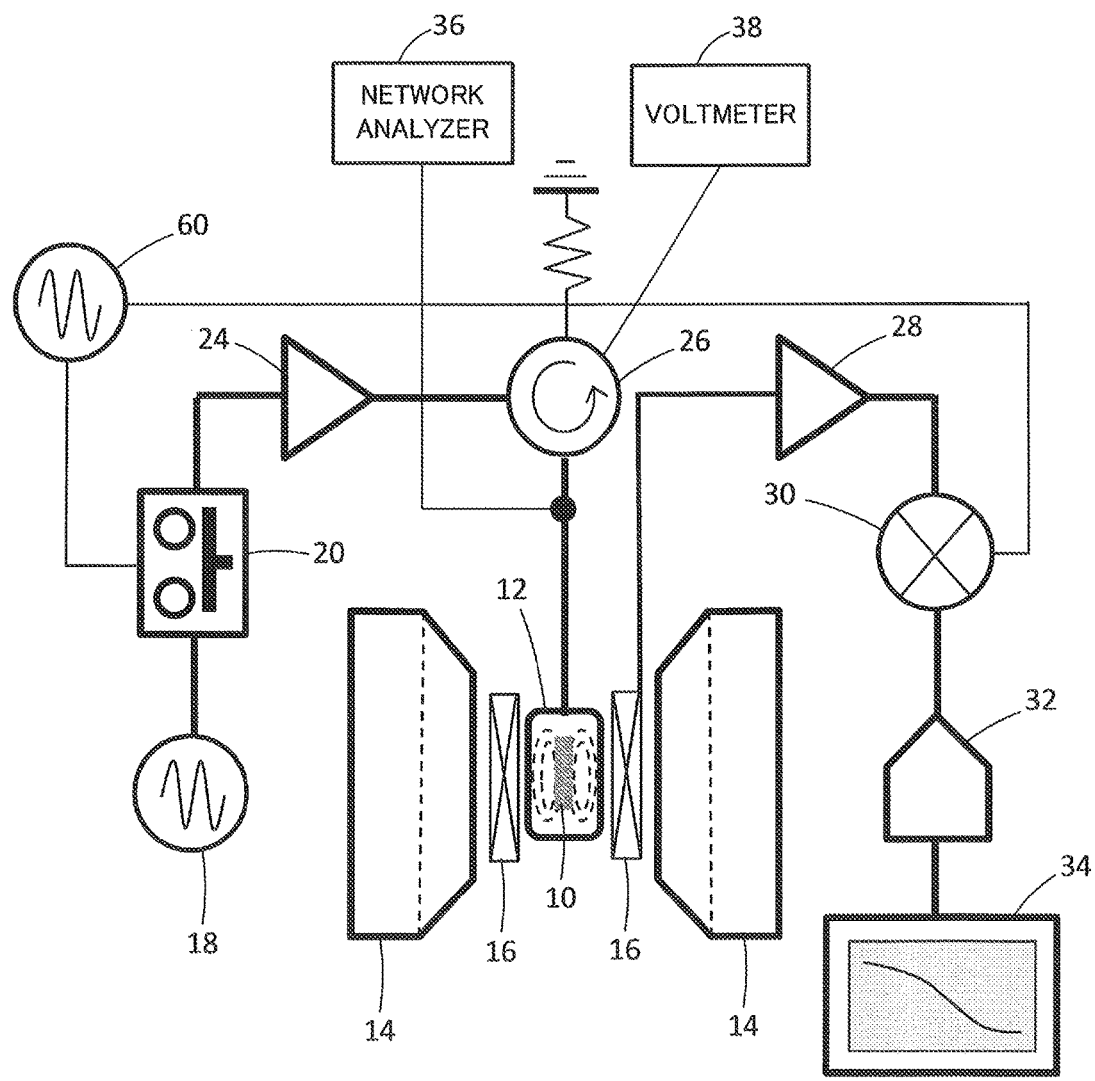
FIG. 12 illustrates an exemplary ESR measuring apparatus according to a second embodiment.
Figure 13:
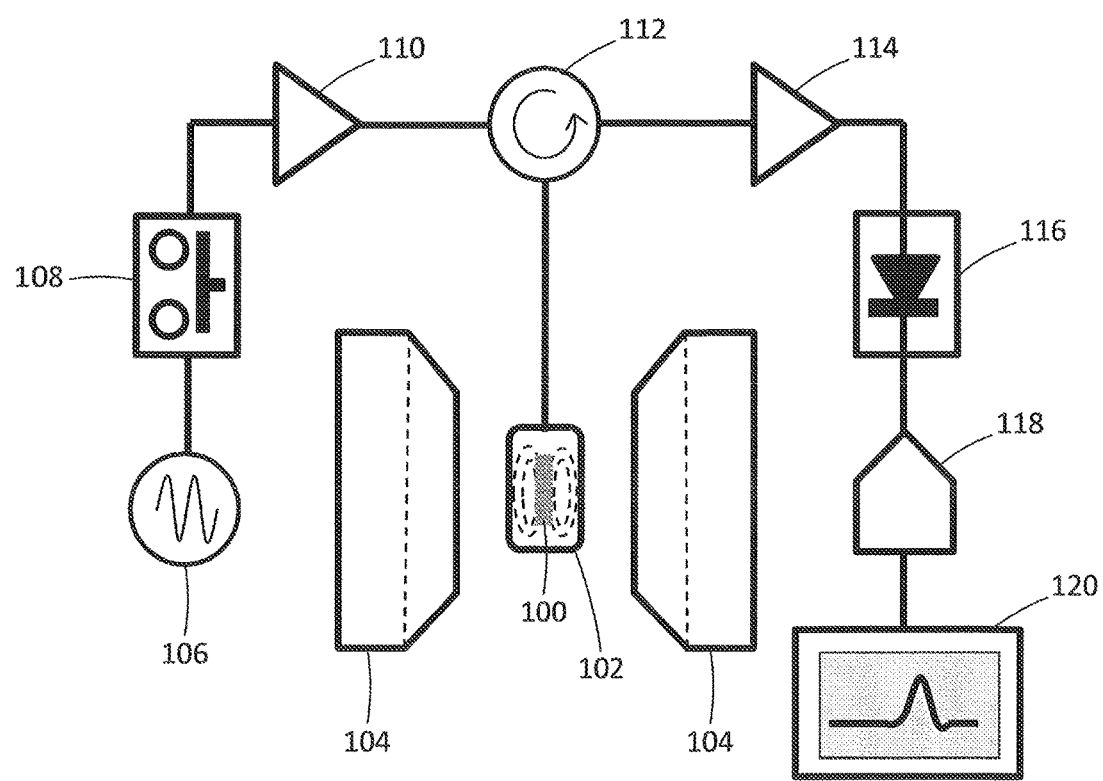
FIG. 13 illustrates an exemplary ESR measuring apparatus for implementing the inversion recovery method.
Figure 14:
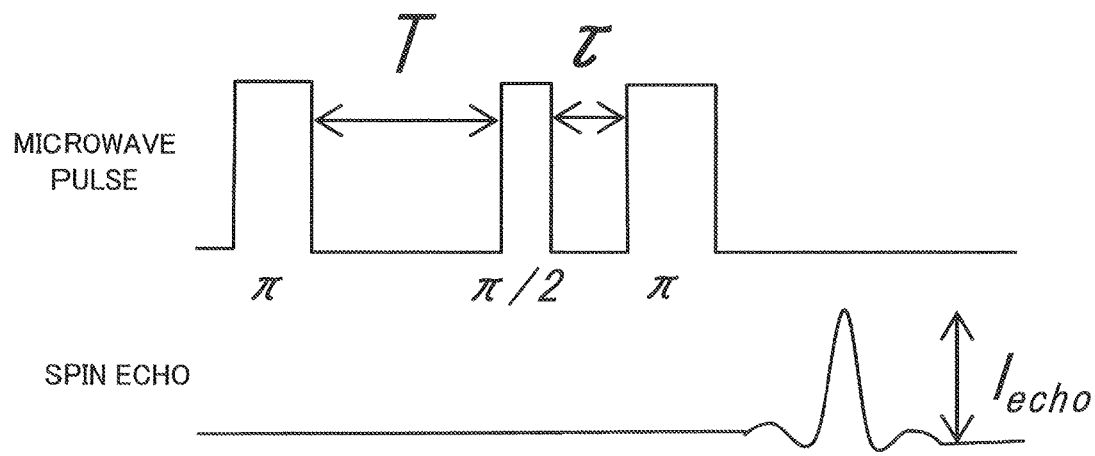
FIG. 14 illustrates microwave pulses usable in the inversion recovery method and a detection signal.
Figure 15:
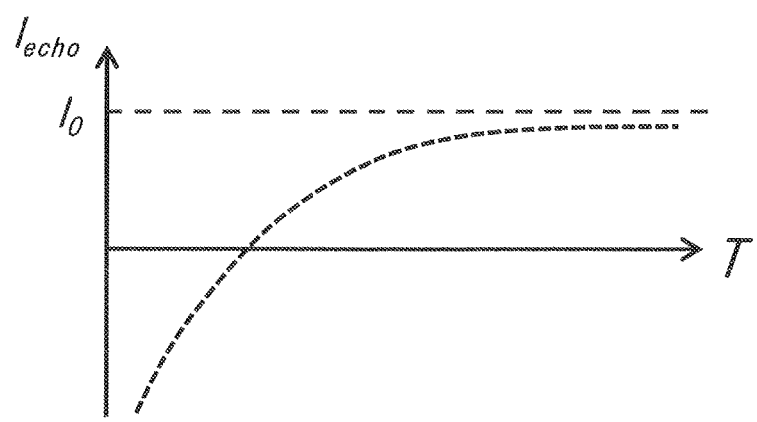
FIG. 15 is a graph illustrating a signal detected according to the inversion recovery method.
Figure 16:
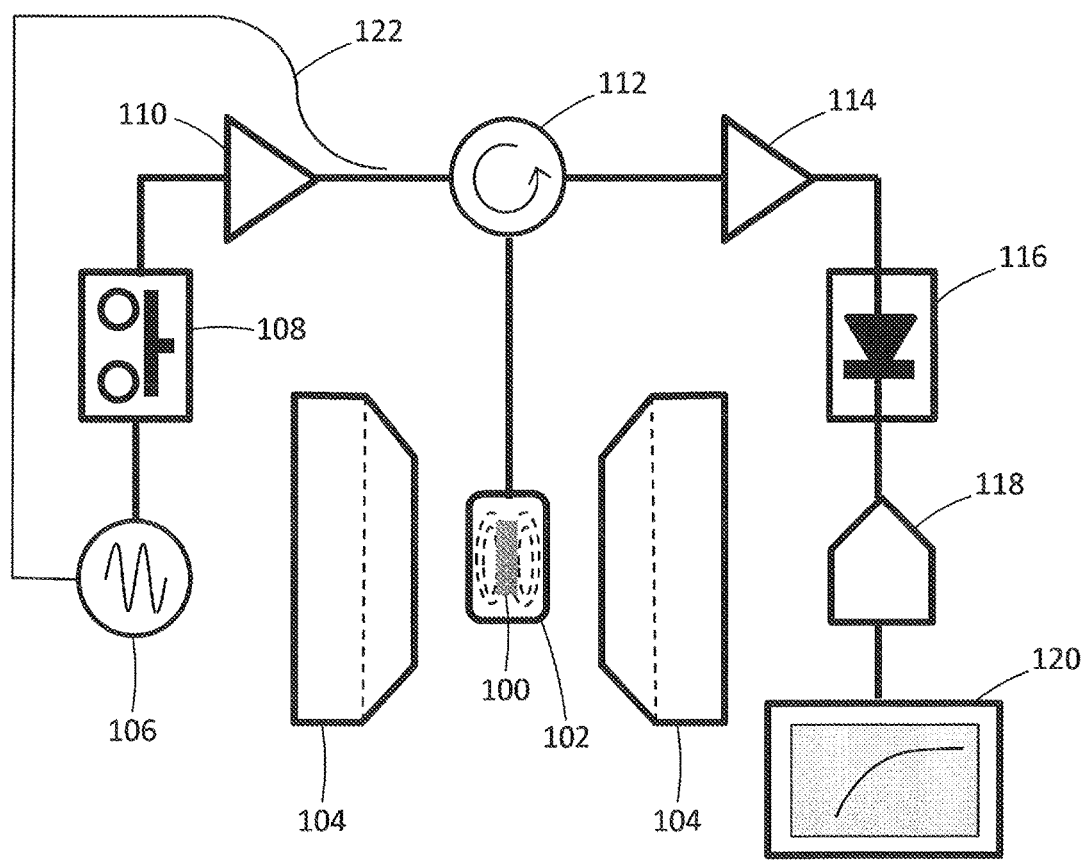
FIG. 16 illustrates an exemplary ESR measuring apparatus for implementing the saturation recovery method.
Figure 17:
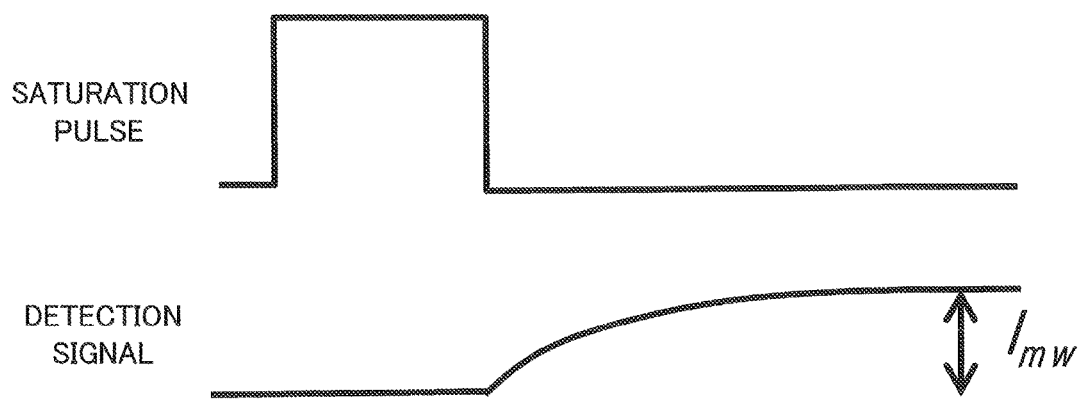
FIG. 17 illustrates a microwave pulse usable in the saturation recovery method and a detection signal.
Figure 18:
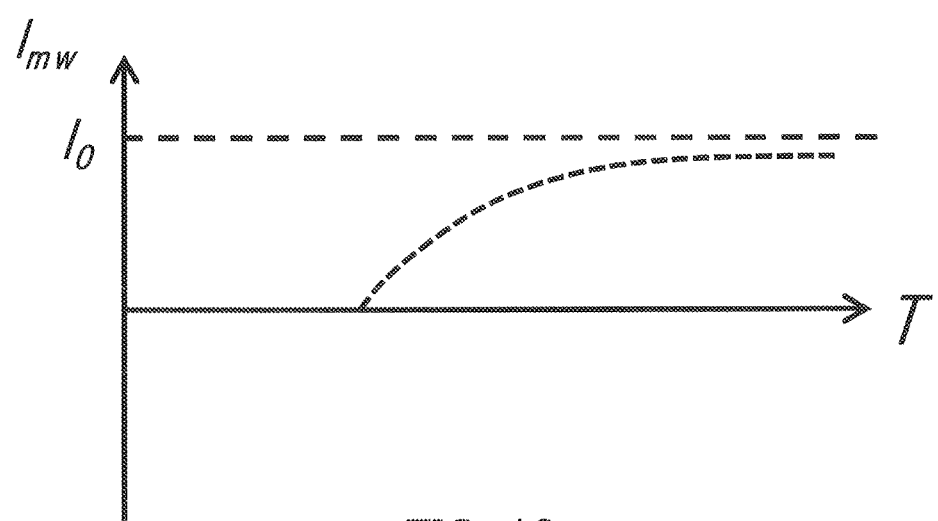
FIG. 18 is a graph illustrating a signal detected according to the saturation recovery method.
Figure 19:
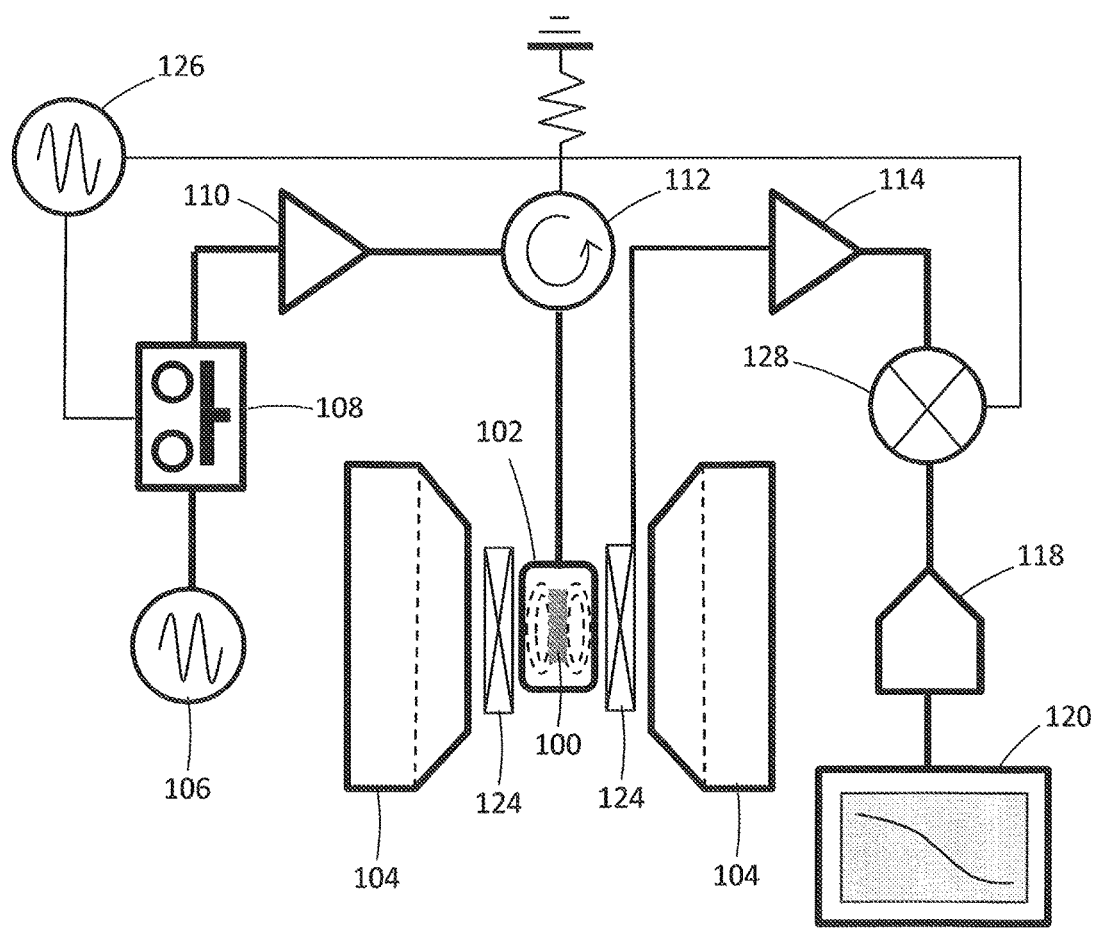
FIG. 19 illustrates an exemplary ESR measuring apparatus for implementing the frequency swept longitudinal detection method (fs-LOD method)
Figure 20:
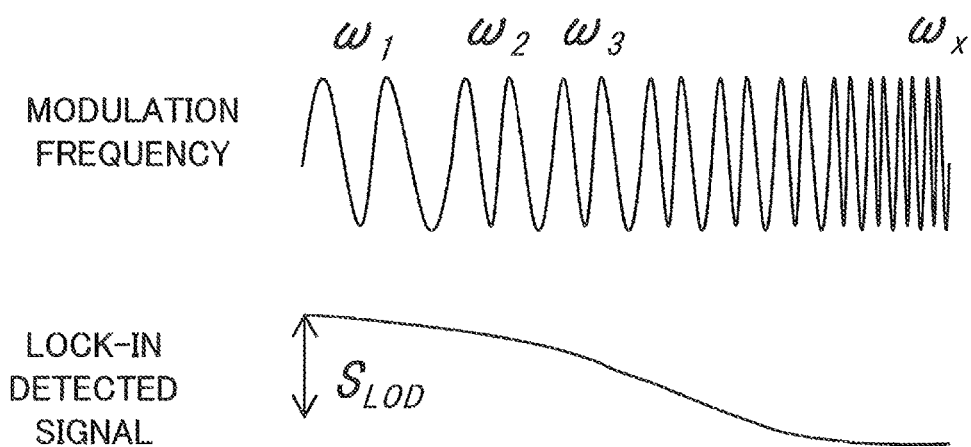
FIG. 20 illustrates a modulation frequency usable in the frequency swept longitudinal detection method (fs-LOD method) and a detection signal.
Figure 21:
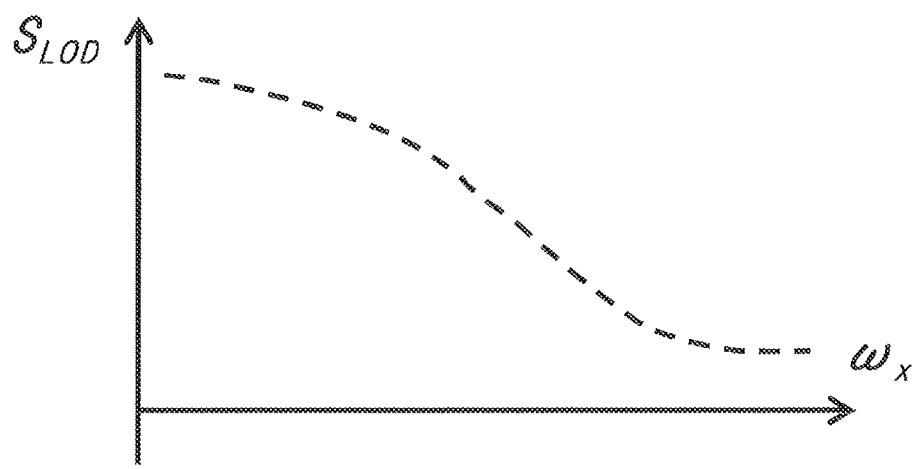
FIG. 21 is a graph illustrating a signal detected according to the frequency swept longitudinal detection method (fs-LOD method)
Figure 22:
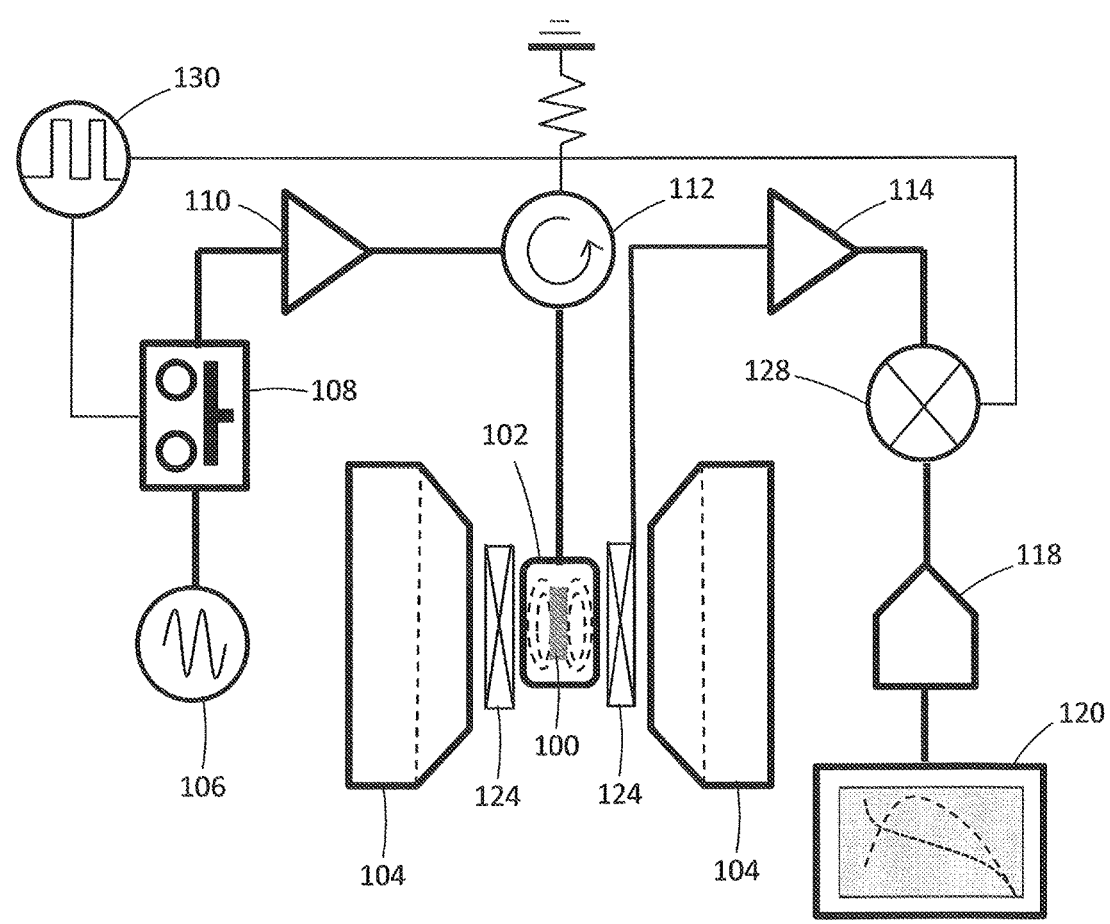
FIG. 22 illustrates an exemplary ESR measuring apparatus for implementing the perturbative LOT-$T_1$ method (i.e., the p-LOD-T1 method)
Figure 23:
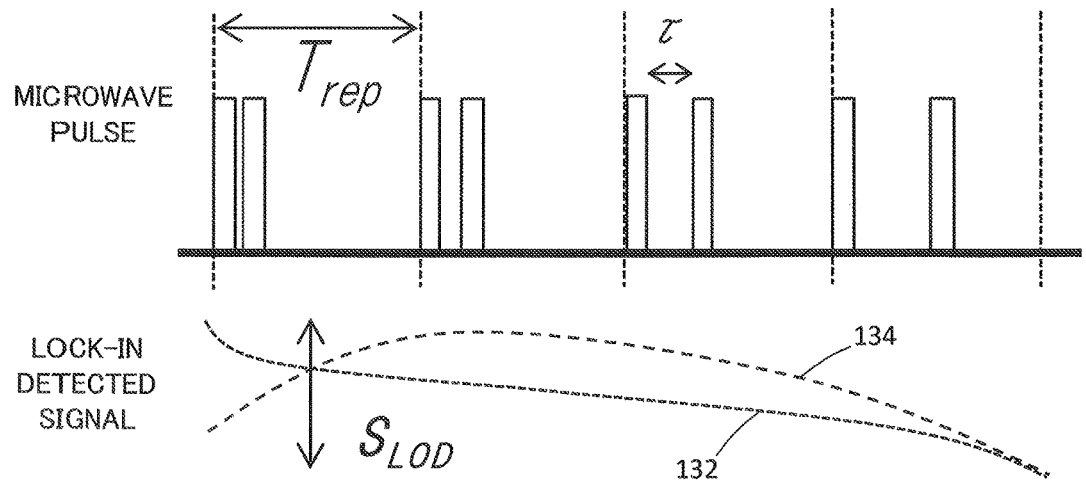
FIG. 23 illustrates a sequence of microwave pulses that can be used in the perturbative LOT-$T_1$ method (i.e., the p-LOD-T1 method) and examples of detection signal.
Figure 24:
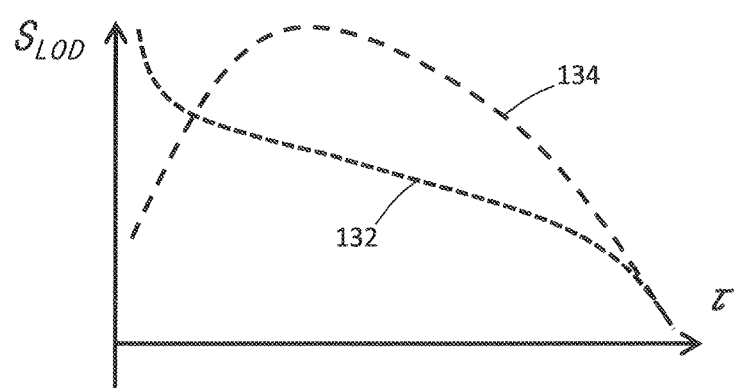
FIG. 24 is a graph illustrating examples of the signal detected according to the perturbative LOT-$T_1$ method (i.e., the p-LOD-T1 method).

Hereinafter, a relaxation time measuring method and an ESR measuring apparatus according to the second embodiment of the present disclosure will be described. FIG. 12 illustrates an exemplary ESR measuring apparatus according to the second embodiment. The illustrated ESR measuring apparatus is an apparatus that can realize the frequency swept longitudinal detection method (fs-LOD method). In FIG. 12, elements similar to those illustrated in FIG. 1 are denoted by the same reference numeral and redundant description thereof is avoided.

A pulse generator 60 generates a reference signal with modulation frequency. The reference signal is supplied to the switch 20 so that the switch 20 can repeat ON and OFF operations according to the modulation frequency. Thus, the microwaves supplied from the microwave oscillator 18 can be modulated according to the modulation frequency. The modulated microwaves are amplified by the amplifier 24 and supplied to the cavity 12 via the circulator 26.

The phase detector 30 performs phase detection (i.e., lock-in detection) on the detection signal using the reference signal supplied from the pulse generator 60. A signal output from the phase detector 30 passes through the AD converter 32. Thus, a DC component signal is supplied to the PC 34. The PC 34 performs signal processing on the supplied signal to obtain an ESR spectrum signal.

Further, similar to the ESR measuring apparatus according to the first embodiment, the ESR measuring apparatus according to the second embodiment includes the network analyzer 36. As another example, the ESR measuring apparatus according to the second embodiment may include the voltmeter 38 instead of using the network analyzer 36.

The measurement of the apparent relaxation time $T_1^*$ includes causing the pulse generator 60 to modulate the output intensity of the microwaves supplied from the microwave oscillator 18 at certain modulation frequency $f_{mod}$ and irradiating the cavity 12 with the modulated microwaves. Similar effects can be obtained by performing simultaneous and continuous irradiation with two high-frequency components separated at frequency $\Delta f$ corresponding to the modulation frequency $f_{mod}$, instead of modulating the microwaves at the modulation frequency $f_{mod}$.

The measurement further includes detecting temporal variation in magnetization of the spin in the direction of the static magnetic field, caused by the above-mentioned irradiation of microwaves, with the pickup coils 16, and performing lock-in detection with the modulation frequency $f_{mod}$ or the frequency $\Delta f$ so that the signal $S_{LOD}$ can be obtained.

Obtaining the signal $S_{LOD}$ while changing the modulation frequency $f_{mod}$ or the frequency $\Delta f$ can obtain attenuation data of the signal $S_{LOD}$ depending on the modulation frequency. The signal $S_{LOD}$ is the signal detected according to the frequency swept longitudinal detection method (the fs-LOD method).

Hereinafter, embodiments 3 and 4, serving as exemplary embodiments of the relaxation time measuring method according to the second embodiment, will be described in detail below.

Embodiment 3

Hereinafter, a relaxation time measuring method according to embodiment 3 will be described. Similar to embodiment 1, the method according to embodiment 3 includes measuring apparent relaxation time $T_1^*$ according to the frequency swept longitudinal detection method (fs-LOD method) while changing the amount of sample 10, obtaining a relationship between the spin-cavity coupling constant $g(\omega)$ and the apparent relaxation time $T_1^*$, and obtaining apparent relaxation time $T_1^*$ corresponding to specific spin-cavity coupling constant $g(\omega)$ based on the obtained relationship. More specifically, embodiment 3 obtains the apparent relaxation time $T_1^*$ corresponding to the specific spin-cavity coupling constant $g(\omega)$ according to the procedure of the following steps 1 to 5.

Step 1 includes calculating spin-cavity coupling constant $g(\omega)$. Similar to the above-mentioned embodiment 1, step 1 includes measuring return loss of the cavity 12 and calculating spin-cavity coupling constant $g(\omega)$ that minimizes the difference between the measured value and the theoretical value (formula (6)).

Similar to the above-mentioned embodiment 1, step 2 includes changing the amount of sample 10 to N levels and calculating spin-cavity coupling constant $g(\omega)$ by applying the processing of step 1, for each target amount of sample 10. Similar to the above-mentioned embodiment 1, step 2 includes measuring $\kappa$, $\kappa'$, and $\gamma_m/2$, for each sample amount, while changing the amount of sample 10 to N levels, and obtaining spin-cavity coupling constant $g(\omega)$ that minimizes the difference between the measured value of the return loss and the theoretical value of $S_{11}$ parameter by substituting the measured parameters into the theoretical formula (formula (6)) of the $S_{11}$ parameter and fitting the theoretical formula to the measured value of the return loss, for respective sample amounts. Therefore, the spin-cavity coupling constant $g(\omega)$ can be obtained for each sample amount. More specifically, a total of N values of spin-cavity coupling constant $g(\omega)$ that are mutually different in coupling state can be obtained.

Step 3 includes measuring apparent relaxation time $T_1^*$, for each target of the sample 10 whose amount is changed to N levels, according to a measuring method in which the apparent relaxation time $T_1^*$ does not change during the ESR measurement. The frequency swept longitudinal detection method (the fs-LOD method) is employed in the second embodiment to measure the apparent relaxation time $T_1^*$. Measuring each target amount of sample 10 can measure the apparent relaxation time $T_1^*$ corresponding to each amount of sample 10; that is, a total of N values of apparent relaxation time $T_1^*$.

Through the above-mentioned processing of steps 1 to 3, a pair of the spin-cavity coupling constant $g(\omega)$ and the apparent relaxation time $T_1^*$ can be formed for each amount of sample 10. As a result, a total of N pairs can be formed. Employing the measuring method in which the apparent relaxation time $T_1^*$ does not change, in step 3, can measure the apparent relaxation time under a constant or substantially constant spin-cavity coupling state (or spin-cavity coupling constant). Therefore, it becomes feasible to associate the spin-cavity coupling constant with the apparent relaxation time.

Similar to embodiment 1, step 4 includes fitting a quadratic function $F[g(\omega)]$ relating to the relaxation rate depending on the spin-cavity coupling constant to the relationship between the N values of spin-cavity coupling constant $g(\omega)$ and the N values of apparent relaxation rate $R^*(=1/T_1^*)$. The fitting processing can obtain function $F[g(\omega)]$ representing the relationship between the spin-cavity coupling constant $g(\omega)$ and the apparent relaxation rate $R^*$.

Similar to embodiment 1, step 5 includes calculating apparent relaxation rate $R^*$ corresponding to specific spin-cavity coupling constant $g(\omega)$ using the function $F[g(\omega)]$ subjected to the fitting processing. Calculating the value of $F[0]$; i.e., the value of function $F[g(\omega)]$ when the spin-cavity coupling constant $g(\omega)$ is zero (0), can obtain true relaxation rate R; namely, true relaxation time $T_1$.

As mentioned above, even in embodiment 3 of the second embodiment, the relationship between the spin-cavity coupling constant $g(\omega)$ and the apparent relaxation time $T_1^*$ can be obtained and it is feasible to obtain the true relaxation time $T_1$ peculiar to the sample even when the spin-cavity coupling appears.

Embodiment 4

Hereinafter, a relaxation time measuring method according to embodiment 4 will be described. The method according to embodiment 4 includes measuring apparent relaxation time $T_1^*$ according to the frequency swept longitudinal detection method (the fs-LOD method) while changing the Q value of cavity 12, obtaining a relationship between the spin-cavity coupling constant $g(\omega)$ and the apparent relaxation time $T_1^*$, and obtaining apparent relaxation time $T_1^*$ corresponding to specific spin-cavity coupling constant $g(\omega)$ based on the obtained relationship. More specifically, embodiment 4 obtains the apparent relaxation time $T_1^*$ corresponding to the specific spin-cavity coupling constant $g(\omega)$ according to the procedure of the following steps 1 to 5.

Step 1 includes calculating spin-cavity coupling constant $g(\omega)$. Similar to the above-mentioned embodiment 1, step 1 includes measuring return loss of the cavity 12 and calculating spin-cavity coupling constant $g(\omega)$ that minimizes the difference between the measured value and the theoretical value.

Similar to the above-mentioned embodiment 2, step 2 includes changing the Q value of cavity 12 to N levels and calculating spin-cavity coupling constant $g(\omega)$ by applying the processing of step 1 at each stage. Similar to embodiment 2, step 2 includes measuring κ, κ', and $\gamma_m/2$, for each Q value, while changing the Q value of cavity 12 to N levels, and obtaining spin-cavity coupling constant $g(\omega)$ that minimizes the difference between the measured value of the return loss and the theoretical value of $S_{11}$ parameter by substituting the measured parameters into the theoretical formula (formula (6)) of the $S_{11}$ parameter and fitting the theoretical formula to the measured value of the return loss, for respective Q values. Therefore, the spin-cavity coupling constant $g(\omega)$ can be obtained for each Q value. More specifically, a total of N values of spin-cavity coupling constant $g(\omega)$ that are mutually different in coupling state can be obtained.

Step 3 includes measuring apparent relaxation time $T_1^*$ according to the frequency swept longitudinal detection method (fs-LOD method) for each target sample 10 disposed in the cavity 12 with Q value changed to N levels. Measuring the target sample 10 disposed in the cavity 12 with each Q value can measure the apparent relaxation time $T_1^*$ corresponding to each Q value. More specifically, a total of N values of apparent relaxation time $T_1^*$ can be measured.

Through the above-mentioned processing of steps 1 to 3, a pair of the spin-cavity coupling constant $g(\omega)$ and the apparent relaxation time $T_1^*$ can be formed for each Q value of cavity 12. As a result, a total of N pairs can be formed. Employing the measuring method in which the apparent relaxation time $T_1^*$ does not change, in step 3, can measure the apparent relaxation time under a constant or substantially constant spin-cavity coupling state (or spin-cavity coupling constant). Therefore, it becomes feasible to associate the spin-cavity coupling constant with the apparent relaxation time.

Similar to embodiment 1, step 4 includes fitting a quadratic function $F[g(\omega)]$ relating to the relaxation rate depending on the spin-cavity coupling constant to the relationship between the N values of spin-cavity coupling constant $g(\omega)$ and the N values of apparent relaxation rate $R^*(=1/T_1^*)$. The fitting processing can obtain function $F[g(\omega)]$ representing the relationship between the spin-cavity coupling constant $g(\omega)$ and apparent relaxation rate $R^*$.

Similar to embodiment 1, step 5 includes calculating apparent relaxation rate $R^*$ corresponding to specific spin-cavity coupling constant $g(\omega)$ using the function $F[g(\omega)]$ subjected to the fitting processing. Calculating the value of $F[0]$ when the spin-cavity coupling constant $g(\omega)$ is zero (0) can obtain true relaxation rate R; namely, true relaxation time $T_1$.

As mentioned above, even in embodiment 4 of the second embodiment, the relationship between the spin-cavity coupling constant $g(\omega)$ and the apparent relaxation time $T_1^*$ can be obtained and it is feasible to obtain the true relaxation time $T_1$ peculiar to the sample even when the spin-cavity coupling appears.

According to the above-mentioned embodiments 1 to 4, the amount of sample 10 or the Q value of cavity 12 is changed to N levels to form N spin-cavity coupling states that are mutually different in coupling state. However, as another method, it is feasible to form N spin-cavity coupling states that are mutually different in coupling state by changing the filling rate of the sample 10 placed in the cavity 12 (i.e., the sample filling rate) to N levels.

In the above-mentioned first and the second embodiments, ESR measuring apparatuses for measuring the relaxation time of electron spins are used as practical examples of the magnetic resonance measuring apparatus. As another example of the magnetic resonance measuring apparatus, NMR measuring apparatuses may be used to measure the relaxation time of nuclear spins. When obtaining the relaxation time of nuclear spins, the interaction between the spin and an NMR probe corresponds to the spin-cavity coupling. Even in this case, obtaining the coupling constant thereof can obtain a correspondence relationship between the apparent relaxation time and the coupling constant.

The invention claimed is:
1. A relaxation time measuring method, comprising:
  forming N spin-cavity coupling states that are mutually different in coupling state between a resonator functioning as a resonance circuit accommodating a sample therein and a spin of the sample, calculating N values of spin-cavity coupling constant that represent constants of the N spin-cavity coupling states, measuring N values of apparent relaxation time through magnetic resonance measurement applied on the sample, and calculating relaxation time corresponding to specific spin-cavity coupling constant based on the relationship between the N values of spin-cavity coupling constant and the N values of apparent relaxation time.

2. The relaxation time measuring method according to claim 1, wherein the calculation of the spin-cavity coupling constants includes calculating spin-cavity coupling constant based on actually measured return loss value of the resonance circuit measured for each magnetic field and a model-based theoretical return loss value of the resonance circuit in a case where the spin-cavity coupling is present.

3. The relaxation time measuring method according to claim 2, wherein the calculation of the spin-cavity coupling constants includes calculating spin-cavity coupling constant that minimizes the difference between the measured value and the theoretical value.

4. The relaxation time measuring method according to claim 1, wherein the sample amount is changed to N levels to form the N spin-cavity coupling states.

5. The relaxation time measuring method according to claim 1, wherein the Q value of the resonance circuit is changed to N levels to form the N spin-cavity coupling states.

6. The relaxation time measuring method according to claim 1, wherein the measurement of the relaxation times includes measuring the apparent relaxation time according to a measuring method in which the apparent relaxation time does not change during the magnetic resonance measurement.

7. The relaxation time measuring method according to claim 1, wherein the calculation of the relaxation times includes calculating the relaxation time corresponding to the specific spin-cavity coupling constant by fitting a quadratic function of the spin-cavity coupling constant to the relationship between the N values of spin-cavity coupling constant and the N values of apparent relaxation time.

8. The relaxation time measuring method according to claim 1, wherein the specific spin-cavity coupling constant is zero and the calculation of the relaxation times includes calculating relaxation time when the spin-cavity coupling constant is zero.

9. A magnetic resonance measuring apparatus, comprising:

a resonator functioning as a resonance circuit accommodating a sample, a forming unit configured to form N spin-cavity coupling states that are mutually different in coupling state, between a spin of the sample and the resonance circuit, a coupling constant calculation unit configured to calculate N values of spin-cavity coupling constant that represent constants of the N spin-cavity coupling states, a measurement unit configured to measure N values of apparent relaxation time through magnetic resonance measurement applied on the sample, and a relaxation time calculation unit configured to calculate relaxation time corresponding to specific spin-cavity coupling constant based on the relationship between the N values of spin-cavity coupling constant and the N values of apparent relaxation time.

10. The magnetic resonance measuring apparatus according to claim 9, wherein the coupling constant calculation unit calculates spin-cavity coupling constant based on actually measured return loss value of the resonance circuit measured for each magnetic field and a model-based theoretical return loss value of the resonance circuit in a state where the spin-cavity coupling is present.

11. The magnetic resonance measuring apparatus according to claim 10, wherein the coupling constant calculation unit calculates a spin-cavity coupling constant that minimizes the difference between the measured value and the theoretical value.

12. The magnetic resonance measuring apparatus according to claim 9, wherein the forming unit forms the N spin-cavity coupling states by changing the Q value of the resonance circuit to N levels.

13. The magnetic resonance measuring apparatus according to claim 9, wherein the measurement unit measures the apparent relaxation time according to a measuring method in which the apparent relaxation time does not change during the magnetic resonance measurement.

14. The magnetic resonance measuring apparatus according to claim 9, wherein the relaxation time calculation unit calculates the relaxation time corresponding to the specific spin-cavity coupling constant by fitting a quadratic function of the spin-cavity coupling constant to the relationship between the N values of spin-cavity coupling constant and the N values of apparent relaxation times.

15. The magnetic resonance measuring apparatus according to claim 9, wherein the specific spin-cavity coupling constant is zero and the relaxation time calculation unit calculates the relaxation time when the spin-cavity coupling constant is zero.

* * * * *